(12) United States Patent
Sekiguchi

(10) Patent No.: US 9,976,034 B1
(45) Date of Patent: May 22, 2018

(54) COLORING COMPOUND, YELLOW TONER, INK, THERMAL TRANSFER RECORDING SHEET, AND COLOR FILTER RESIST COMPOSITION

(71) Applicant: CANON KABUSHIKI KAISHA, Tokyo (JP)

(72) Inventor: Takeshi Sekiguchi, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days. days.

(21) Appl. No.: 15/791,758

(22) Filed: Oct. 24, 2017

(30) Foreign Application Priority Data

Oct. 27, 2016 (JP) .................... 2016-211024

(51) Int. Cl.
| | |
|---|---|
| *C09B 33/24* | (2006.01) |
| *C09B 5/52* | (2006.01) |
| *C09D 11/037* | (2014.01) |
| *B41M 5/52* | (2006.01) |
| *C09D 11/322* | (2014.01) |
| *G03G 9/09* | (2006.01) |
| *C09B 35/378* | (2006.01) |
| *G03F 7/00* | (2006.01) |

(52) U.S. Cl.
CPC ............. *C09B 33/24* (2013.01); *B41M 5/52* (2013.01); *C09B 35/378* (2013.01); *C09D 11/037* (2013.01); *C09D 11/322* (2013.01); *G03F 7/0007* (2013.01); *G03G 9/091* (2013.01)

(58) Field of Classification Search
None
See application file for complete search history.

(56) References Cited

U.S. PATENT DOCUMENTS 8,372,190 B2 * 2/2013 Tateishi ............... B41M 5/0023
106/31.48

FOREIGN PATENT DOCUMENTS

| JP | 2004-002630 A | 1/2004 |
|---|---|---|
| JP | 2005-501134 A | 1/2005 |
| JP | 2007-063520 A | 3/2007 |
| JP | 2013-173883 A | 9/2013 |
| JP | 5312125 B2 | 10/2013 |
| JP | 5469951 B2 | 4/2014 |

* cited by examiner

*Primary Examiner* — Kamal Saeed
(74) *Attorney, Agent, or Firm* — Canon U.S.A. Inc., IP Division

(57) ABSTRACT

A coloring compound with a structure represented by the following formula (1):

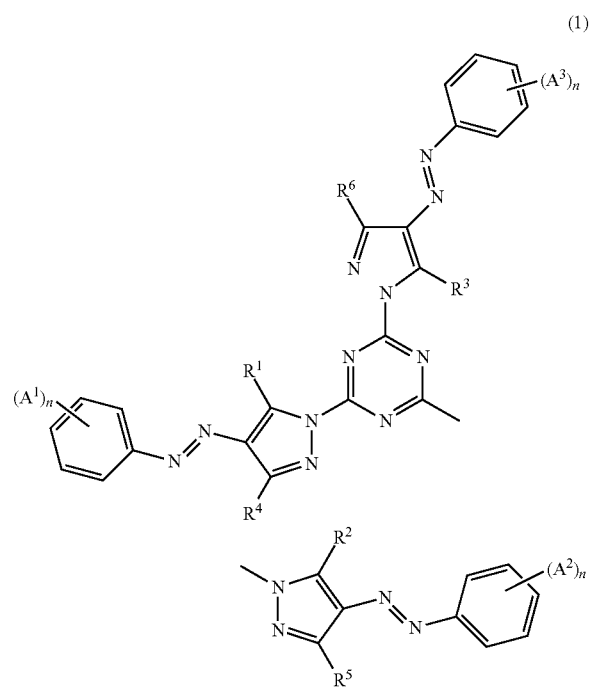

wherein $R^1$ to $R^3$ independently denote a hydrogen atom, an unsubstituted amino group, or an amino group with a substituent,
$R^4$ to $R^6$ independently denote a hydrogen atom, an alkyl group, an unsubstituted aryl group, or an aryl group with a substituent,
$A^1$ to $A^3$ independently denote a hydrogen atom, an alkyl group, an alkoxy group, an aryl group, a carbamoyl group, an alkoxycarbonyl group, a carboxylic acid amide group, an alkoxysulfonyl group, a sulfonic acid amide group, a trifluoromethyl group, a cyano group, a hydroxy group, a nitro group, an amino group, or a halogen atom, and the aryl group, the carboxylic acid amide group, the sulfonic acid amide group, and the amino group in $A^1$ to $A^3$ may have a substituent, and
n denotes an integer in the range of 1 to 5.

6 Claims, No Drawings

COLORING COMPOUND, YELLOW TONER, INK, THERMAL TRANSFER RECORDING SHEET, AND COLOR FILTER RESIST COMPOSITION

BACKGROUND OF THE INVENTION

Field of the Invention

The present disclosure relates to a coloring compound, and a toner, an ink, a thermal transfer recording sheet, and a color filter resist composition each containing the coloring compound.

Description of the Related Art

There is an increasing demand for improved image quality of color images in various printed materials and liquid crystal displays. Thus, there is a strong demand for a coloring compound that has absorption characteristics enabling the desired color reproduction range and can withstand various use and environmental conditions.

Pyrazole azo compounds have been studied mainly as dyes but generally have low light resistance. Pyrazole azo compounds with high light resistance have also been studied, and pigmented pyrazole azo compounds have been reported (Japanese Patent Laid-Open No. 2013-173883, Japanese Patent No. 5312125, and Japanese Patent No. 5469951). Although these compounds have improved light resistance, these compounds have decreased optical densities. Thus, there is a demand for a coloring compound with high light resistance and optical density.

SUMMARY OF THE INVENTION

The present disclosure provides a coloring compound with high optical density and light resistance. The present disclosure also provides a yellow toner, an ink, a thermal transfer recording sheet, and a color filter resist composition each containing a coloring compound with high optical density and light resistance.

The present disclosure relates to a coloring compound with a structure represented by the following general formula (1):

wherein $R^1$ to $R^3$ independently denote a hydrogen atom, an unsubstituted amino group, or an amino group with a substituent, $R^4$ to $R^6$ independently denote a hydrogen atom, an alkyl group, an unsubstituted aryl group, or an aryl group with a substituent, $A^1$ to $A^3$ independently denote a hydrogen atom, an alkyl group, an alkoxy group, an aryl group, a carbamoyl group, an alkoxycarbonyl group, a carboxylic acid amide group, an alkoxysulfonyl group, a sulfonic acid amide group, a trifluoromethyl group, a cyano group, a hydroxy group, a nitro group, an amino group, or a halogen atom, and the aryl group, the carboxylic acid amide group, the sulfonic acid amide group, and the amino group in $A^1$ to $A^3$ may have a substituent, and n denotes an integer in the range of 1 to 5.

Further features will become apparent from the following description of exemplary embodiments.

DESCRIPTION OF THE EMBODIMENTS

As a result of extensive studies to solve the problems described above, the present inventors have found that a coloring compound with a structure represented by the following general formula (1) has high optical density and light resistance. The present inventors have also found that the coloring compound can be used to produce a yellow toner, an ink, a thermal transfer recording sheet, and a color filter resist composition with high optical density and light resistance.

general formula (1)

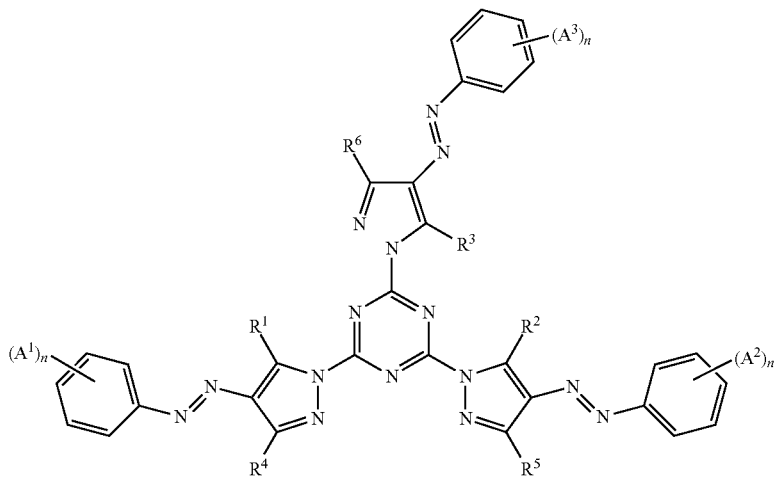

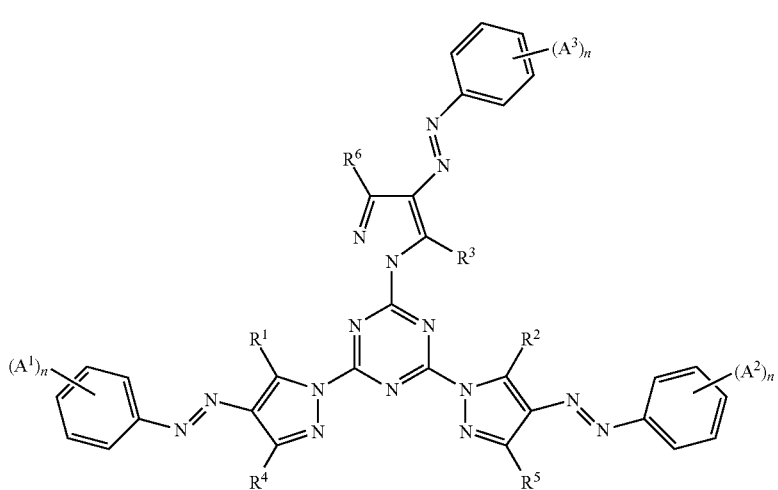

general formula (1)

In the general formula (1), $R^1$ to $R^3$ independently denote a hydrogen atom, an unsubstituted amino group, or an amino group with a substituent, $R^4$ to $R^6$ independently denote a hydrogen atom, an alkyl group, an unsubstituted aryl group, or an aryl group with a substituent, $A^1$ to $A^3$ independently denote a hydrogen atom, an alkyl group, an alkoxy group, an aryl group, a carbamoyl group, an alkoxycarbonyl group, a carboxylic acid amide group, an alkoxysulfonyl group, a sulfonic acid amide group, a trifluoromethyl group, a cyano group, a hydroxy group, a nitro group, an amino group, or a halogen atom, and the aryl group, the carboxylic acid amide group, the sulfonic acid amide group, and the amino group in $A^1$ to $A^3$ may have a substituent, and n denotes an integer in the range of 1 to 5.

First, a coloring compound represented by the formula (1) will be described below.

$R^1$ to $R^3$ in the general formula (1) independently denote a hydrogen atom, an unsubstituted amino group, or an amino group with a substituent.

The substituent of the amino group in $R^1$ to $R^3$ in the general formula (1) may be, but is not limited to, an alkyl group, an acyl group, or a benzoyl group. More specifically, the amino group with a substituent may be a disubstituted amino group, such as a dimethylamino group, a diethylamino group, a di(ethylhexyl)amino group, or a diacylamino group; or a monosubstituted amino group, such as an acylamino group or a benzoylamino group.

$R^4$ to $R^6$ in the general formula (1) independently denote a hydrogen atom, an alkyl group, an unsubstituted aryl group, or an aryl group with a substituent.

The alkyl group in $R^4$ to $R^6$ in the general formula (1) may be, but is not limited to, a linear, branched, or cyclic, primary, secondary, or tertiary alkyl group with 1 to 20 carbon atoms, such as a methyl group, an ethyl group, a n-propyl group, an iso-propyl group, a n-butyl group, a sec-butyl group, a tert-butyl group, an octyl group, a dodecyl group, a nonadecyl group, a cyclobutyl group, a cyclopentyl group, a cyclohexyl group, a methylcyclohexyl group, a 2-ethylpropyl group, or a 2-ethylhexyl group.

The unsubstituted aryl group in $R^4$ to $R^6$ in the general formula (1) may be, but is not limited to, a phenyl group. The substituent in the aryl group with a substituent may be an alkyl group. More specifically, the aryl group with a substituent may be a methylphenyl group or a dimethylphenyl group.

$A^1$ to $A^3$ in the general formula (1) independently denote a hydrogen atom, an alkyl group, an alkoxy group, an aryl group, a carbamoyl group, a carboxylate group, a carboxylic acid amide group, a sulfonic ester group, a sulfonic acid amide group, a trifluoromethyl group, a cyano group, a hydroxy group, a nitro group, an amino group, or a halogen atom. The aryl group, the carboxylic acid amide group, the sulfonic acid amide group, and the amino group in $A^1$ to $A^3$ may have a substituent.

The alkyl group in $A^1$ to $A^3$ in the general formula (1) may be, but is not limited to, a linear, branched, or cyclic alkyl group with 1 to 20 carbon atoms, such as a methyl group, an ethyl group, a n-propyl group, an iso-propyl group, a n-butyl group, a sec-butyl group, a tert-butyl group, an octyl group, a dodecyl group, a nonadecyl group, a cyclobutyl group, a cyclopentyl group, a cyclohexyl group, a methylcyclohexyl group, a 2-ethylpropyl group, or a 2-ethylhexyl group.

The alkoxy group in $A^1$ to $A^3$ in the general formula (1) may be, but is not limited to, a methoxy group, an ethoxy group, a propoxy group, or a butoxy group.

The unsubstituted aryl group in $A^1$ to $A^3$ in the general formula (1) may be, but is not limited to, a phenyl group. The substituent in the aryl group with a substituent may be an alkyl group. More specifically, the aryl group with a substituent may be a methylphenyl group or a dimethylphenyl group.

The alkoxycarbonyl group (—COOR) in $A^1$ to $A^3$ in the general formula (1) may be, but is not limited to, a methoxycarbonyl group, an ethoxycarbonyl group, a butoxycarbonyl group, or an ethylhexoxycarbonyl group.

The carboxylic acid amide group in $A^1$ to $A^3$ in the general formula (1) may be unsubstituted or may have a substituent. The carboxylic acid amide group with a substituent may be, but is not limited to, a carboxylic acid dialkylamide group, such as a carboxylic acid dimethylamide group, a carboxylic acid diethylamide group, or a carboxylic acid di(ethylhexyl) amide group, or a carboxylic acid monoalkylamide group, such as a carboxylic acid methylamide group, a carboxylic acid ethylamide group, or a carboxylic acid ethylhexylamide group.

The alkoxysulfonyl group (—$SO_2OR$) in $A^1$ to $A^3$ in the general formula (1) may be, but is not limited to, a methoxysulfonyl group, an ethoxysulfonyl group, propoxysulfonyl group, or a butoxysulfonyl group.

The sulfonic acid amide group in $A^1$ to $A^3$ in the general formula (1) may be unsubstituted or may have a substituent. The sulfonic acid amide group with a substituent may be a sulfonic acid dialkylamide group, such as a sulfonic acid dimethylamide group or a sulfonic acid diethylamide group, or a sulfonic acid monoalkylamide group, such as a sulfonic acid methylamide group, a sulfonic acid ethylamide group, or a sulfonic acid ethylhexylamide group.

The substituent of the amino group in $A^1$ to $A^3$ in the general formula (1) may be, but is not limited to, an alkyl group, an acyl group, or a benzoyl group. More specifically, the amino group with a substituent may be a disubstituted amino group, such as a dimethylamino group, a diethylamino group, a di(ethylhexyl)amino group, or a diacylamino group; or a monosubstituted amino group, such as an acylamino group or a benzoylamino group.

The halogen atom in $A^1$ to $A^3$ in the general formula (1) may be, but is not limited to, a fluorine atom, a chlorine atom, a bromine atom, or an iodine atom.

In particular, any or all of $A^1$ to $A^3$ in the general formula (1) may be an alkoxycarbonyl group, a carboxylic acid amide group, an alkoxysulfonyl group, or a sulfonic acid amide group. These groups can further improve the optical density and light resistance of a coloring compound represented by the general formula (1).

In the general formula (1), n ranges from 1 to 5, and 1 to 5 substituents may be located at any position.

A coloring compound represented by the general formula (1) can be synthesize by a known method, for example, described in Japanese Patent Laid-Open No. 2013-173883.

The color tone and saturation of a coloring compound represented by the general formula (1) depend on the purpose of each application. Coloring compounds represented by the general formula (1) may be used alone or in combination. Furthermore, two or more known pigments and dyes may be used in combination.

Specific examples of a coloring compound according to an embodiment of the present disclosure include, but are not limited to, the following coloring compounds (1) to (20).

Compound (1)

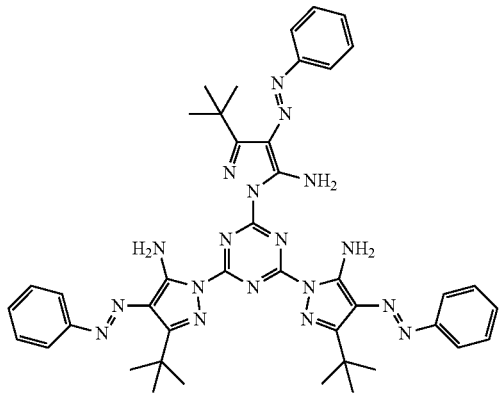

Compound (2)

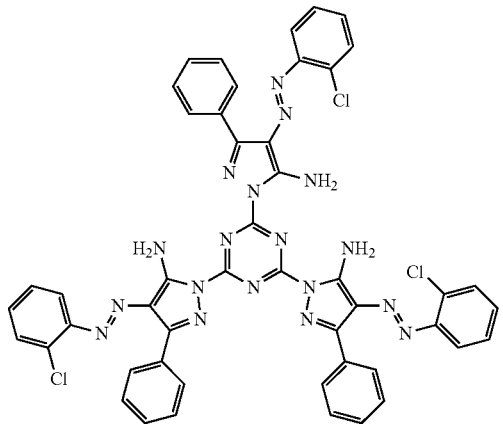

Compound (3)

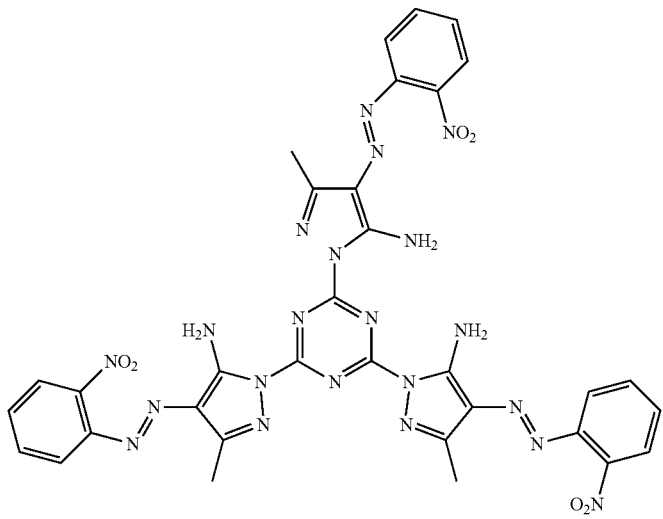

-continued
Compound (4)
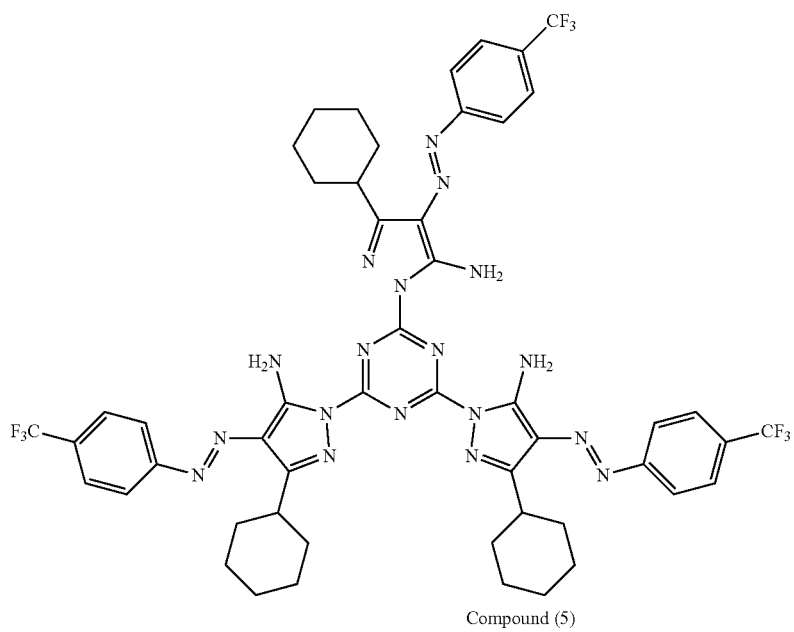
Compound (5)
Compound (6)
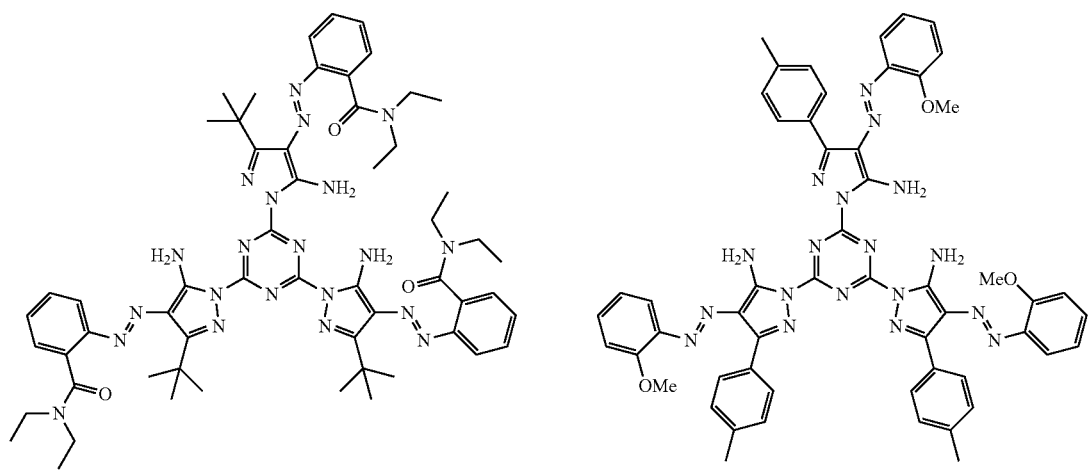
Compound (7)
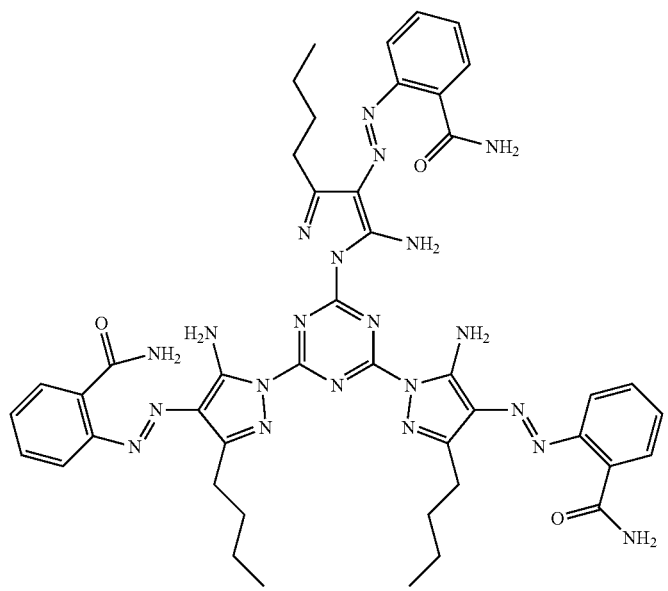

-continued
Compound (8)
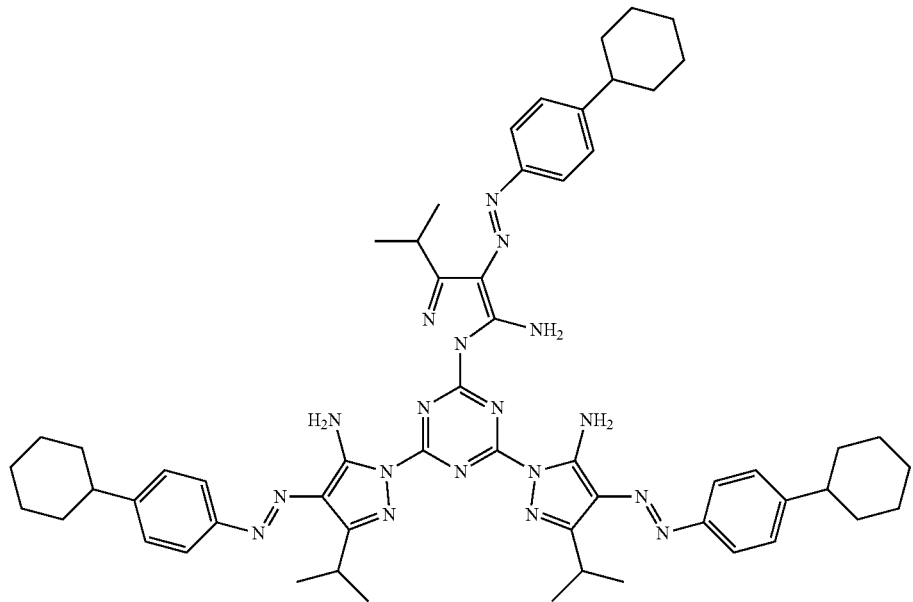
Compound (9)
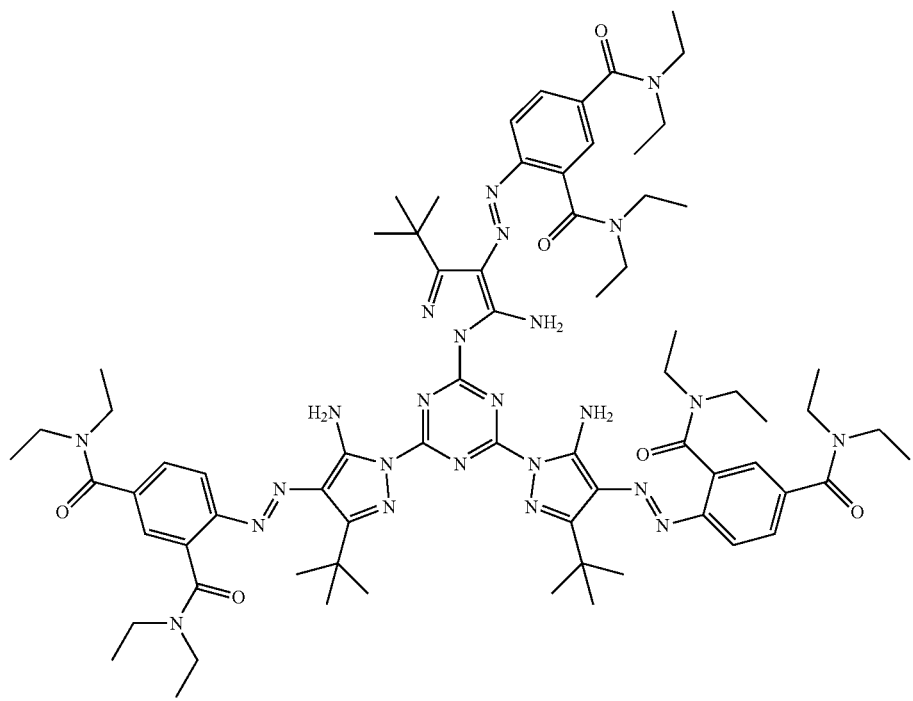

-continued
Compound (10)
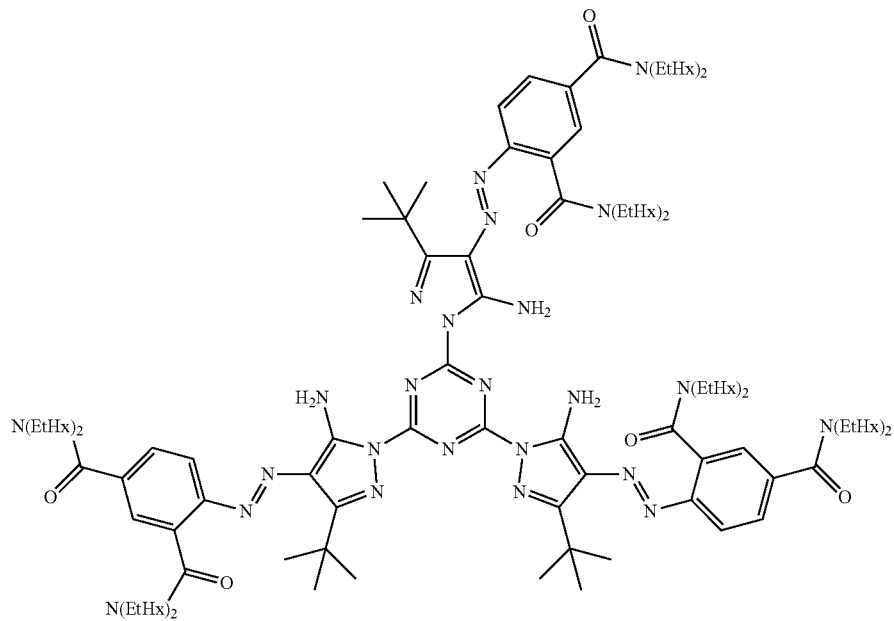
Compound (11)
Compound (12)
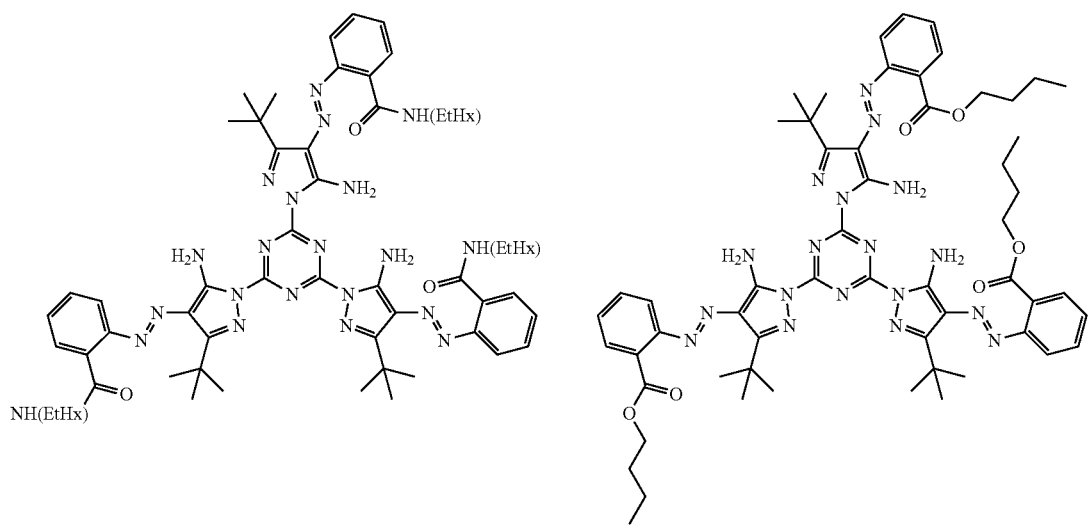

Compound (13)
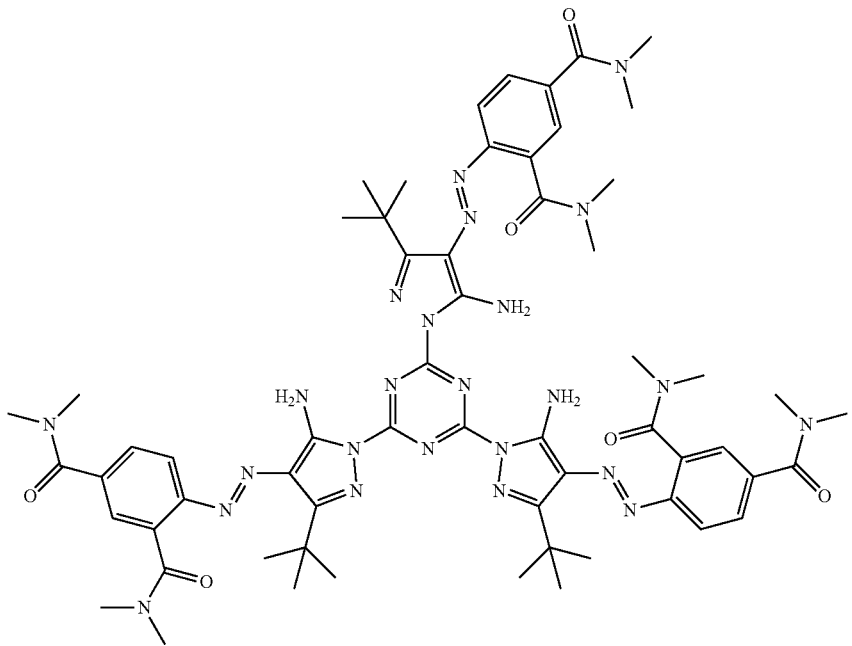
Compound (14)
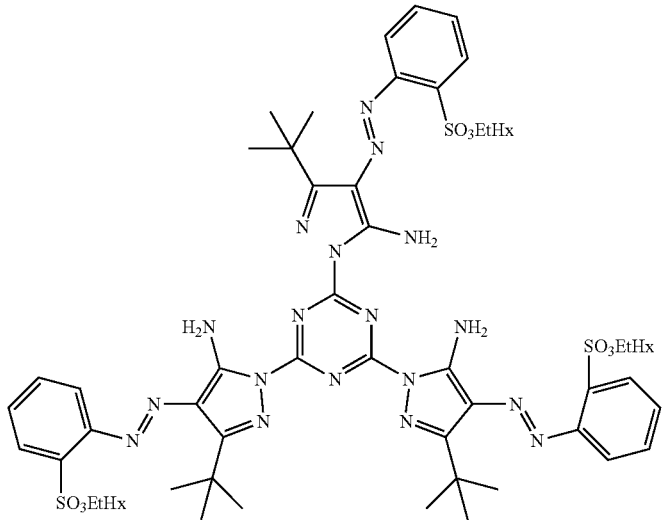

Compound (15)
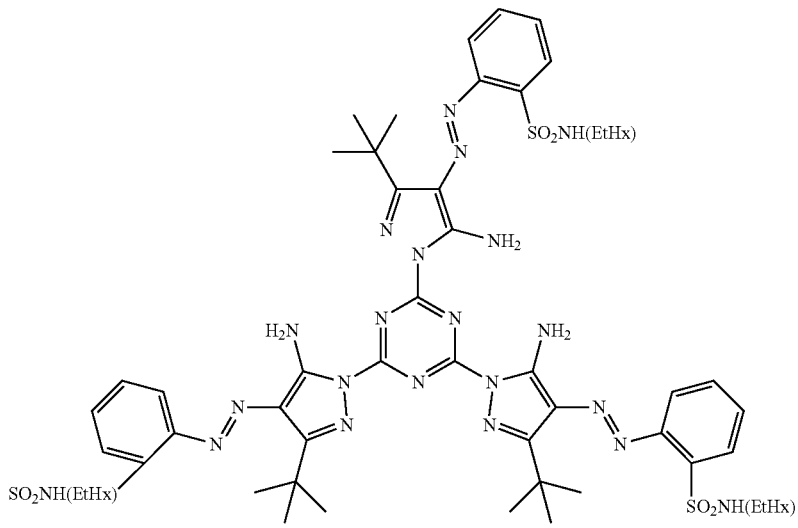
Compound (16)
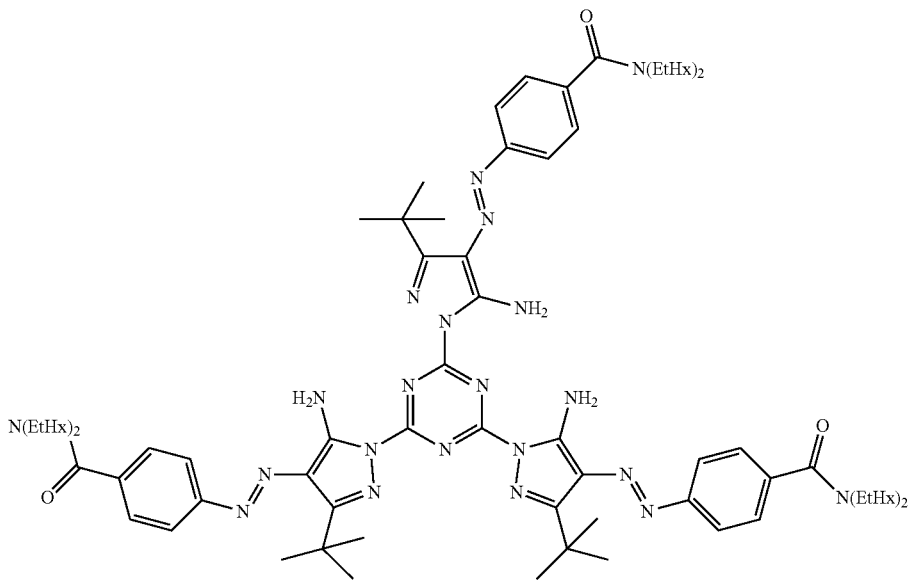

Compound (17)
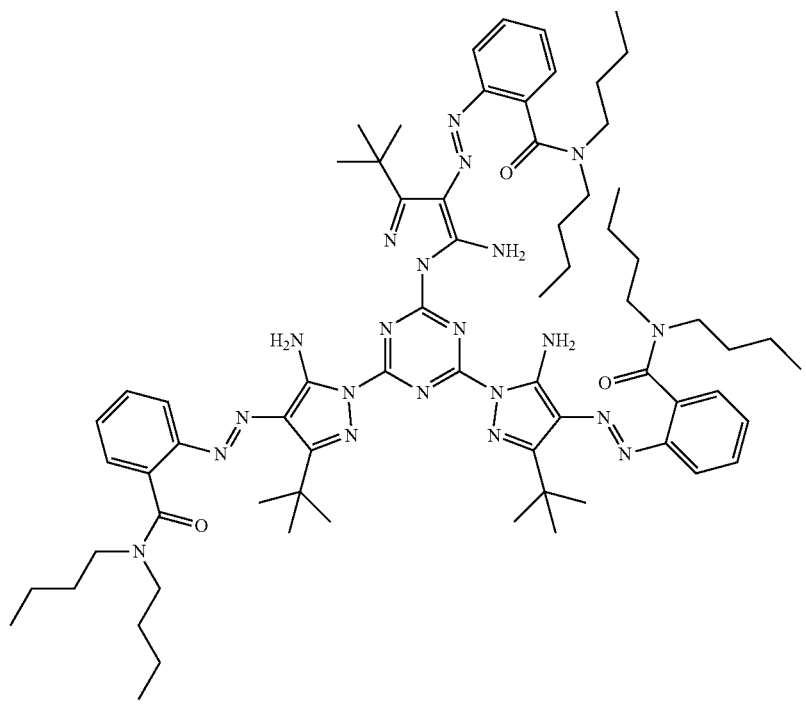
Compound (18)
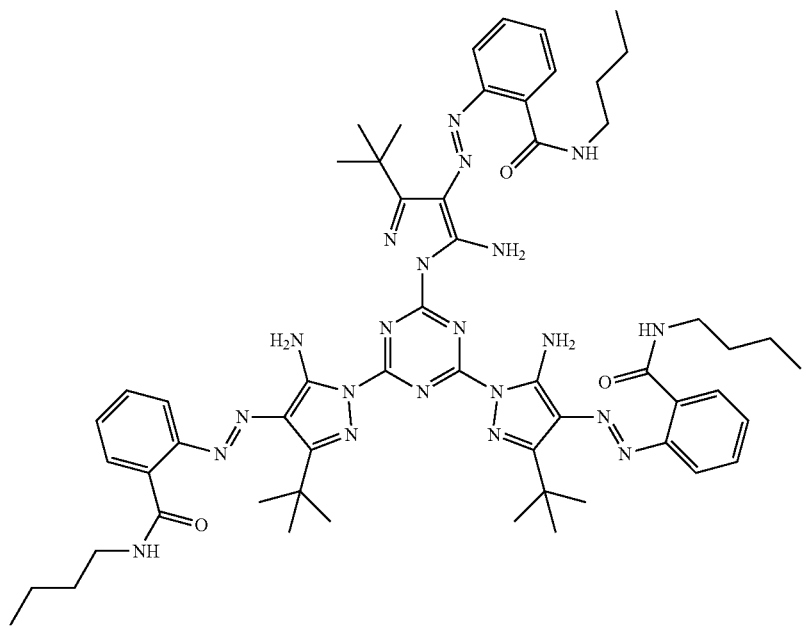

-continued

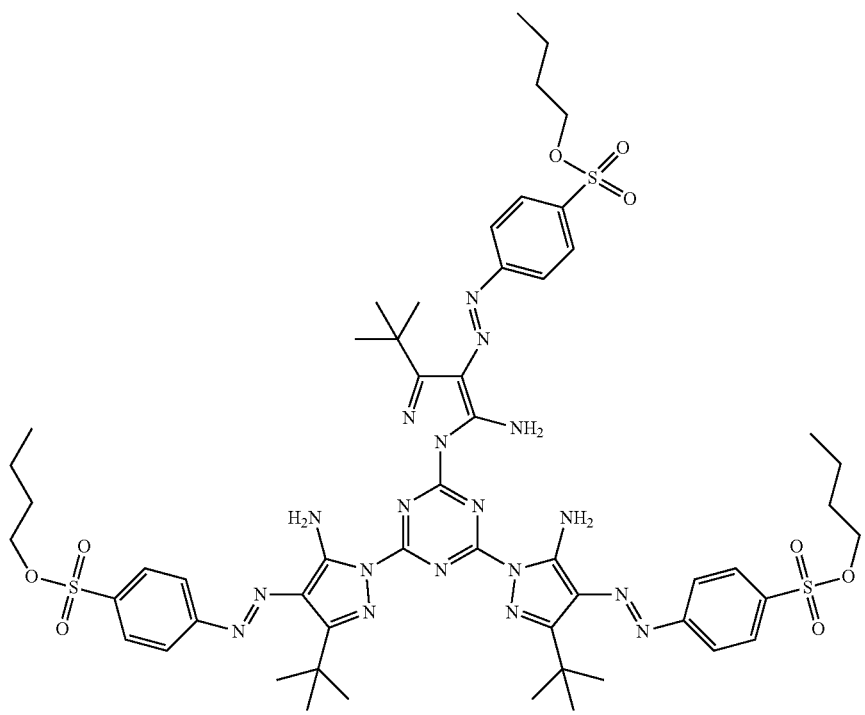

Compound (19)

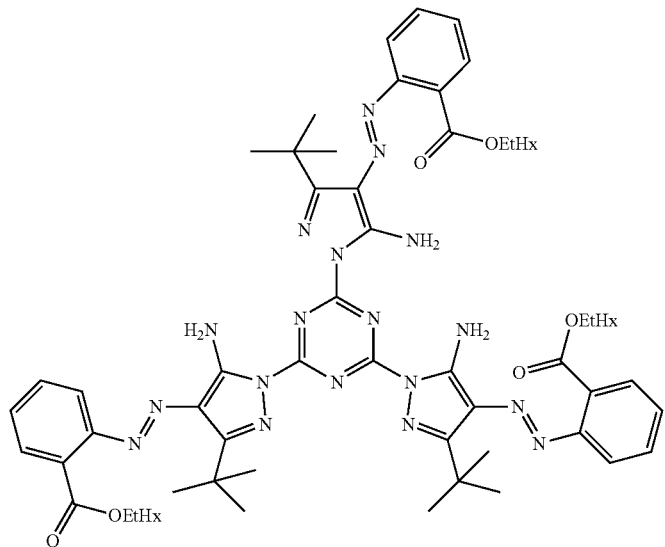

Compound (20)

In these compounds, EtHx denotes a 2-ethylhexyl group.

<Yellow Toner>

A yellow toner according to an embodiment of the present disclosure will be described below.

A yellow toner according to an embodiment of the present disclosure contains a coloring compound represented by the general formula (1) as a colorant. A yellow toner according to an embodiment of the present disclosure contains a binder resin, a wax, and/or a charge control agent, if necessary.

The constituent materials of the toner will be described below.

[Binder Resin]

The binder resin for use in the toner may be, but is not limited to, a thermoplastic resin.

More specifically, the binder resin may be a homopolymer or copolymer of styrene, such as styrene, p-chlorostyrene, or α-methylstyrene (styrene resin); a homopolymer or copolymer of an ester with a vinyl group, such as methyl acrylate, ethyl acrylate, n-propyl acrylate, n-butyl acrylate, lauryl acrylate, 2-ethylhexyl acrylate, methyl methacrylate, ethyl methacrylate, n-propyl methacrylate, lauryl methacrylate, or 2-ethylhexyl methacrylate (vinyl resin); a homopolymer or copolymer of a vinyl nitrile, such as acrylonitrile or methacrylonitrile (vinyl resin); a homopolymer or copolymer of a vinyl ether, such as vinyl ethyl ether or vinyl isobutyl ether (vinyl resin); a homopolymer or copolymer of vinyl methyl ketone, vinyl ethyl ketone, or vinyl isopropenyl ketone (vinyl resin); a homopolymer or copolymer of an olefin, such as ethylene, propylene, butadiene, or isoprene (olefin resin); a non-vinyl condensation resin, such as an epoxy resin, a polyester resin, a polyurethane resin, a polyamide resin, a cellulose resin, or a polyether resin, or a graft polymer of the non-vinyl condensation resin and a vinyl monomer. The binder resin can be a polyester resin. These resins may be used alone or in combination.

Polyester resins are synthesized from acid-derived components (dicarboxylic acids) and alcohol-derived components (diols). The term "acid-derived component", as used herein, refers to a moiety that is an acid component before the synthesis of polyester resins. The term "alcohol-derived component", as used herein, refers to a moiety that is an alcohol component before the synthesis of polyester resins.

The acid-derived component may be, but is not limited to, a component derived from an aliphatic dicarboxylic acid, a component derived from a dicarboxylic acid with a double bond, or a component derived from a dicarboxylic acid with a sulfonic acid group. More specifically, the acid-derived component may be oxalic acid, malonic acid, succinic acid, glutaric acid, adipic acid, pimelic acid, suberic acid, azelaic acid, sebacic acid, 1,9-nonanedicarboxylic acid, 1,10-decanedicarboxylic acid, 1,11-undecanedicarboxylic acid, 1,12-dodecanedicarboxylic acid, 1,13-tridecanedicarboxylic acid, 1,14-tetradecanedicarboxylic acid, 1,16-hexadecanedicarboxylic acid, 1,18-octadecanedicarboxylic acid, or a lower alkyl ester or acid anhydride thereof. In particular, the acid-derived component can be a component derived from an aliphatic dicarboxylic acid, and the aliphatic moiety of the aliphatic dicarboxylic acid can be a saturated carboxylic acid.

The alcohol-derived component may be, but is not limited to, an aliphatic diol. For example, the alcohol-derived component may be ethylene glycol, 1,3-propanediol, 1,4-butanediol, 1,5-pentanediol, 1,6-hexanediol, 1,7-heptanediol, 1,8-octanediol, 1,9-nonanediol, 1,10-decanediol, 1,11-dodecanediol, 1,12-undecanediol, 1,13-tridecanediol, 1,14-tetradecanediol, 1,18-octadecanediol, or 1,20-eicosanediol.

In an embodiment of the present disclosure, in order to increase the mechanical strength of toner particles and control the molecular weight of toner molecules, a crosslinking agent may be used in the synthesis of the binder resin.

The crosslinking agent for use in a toner according to an embodiment of the present disclosure may be, but is not limited to, a bifunctional crosslinking agent, such as divinylbenzene, bis(4-acryloxypolyethoxyphenyl)propane, ethylene glycol di(meth)acrylate, 1,3-butylene glycol di(meth)acrylate, 1,4-butanediol di(meth)acrylate, 1,5-pentanediol di(meth)acrylate, 1,6-hexanediol di(meth)acrylate, neopentyl glycol di(meth)acrylate, diethylene glycol di(meth)acrylate, triethylene glycol di(meth)acrylate, tetraethylene glycol di(meth)acrylate, di(meth)acrylate of poly(ethylene glycol) #200, #400, or #600, dipropylene glycol di(meth)acrylate, poly(propylene glycol) di(meth)acrylate, or a polyester di(meth)acrylate.

The crosslinking agent may also be, but is not limited to, a polyfunctional crosslinking agent, such as pentaerythritol tri(meth)acrylate, trimethylolethane tri(meth)acrylate, trimethylolpropane tri(meth)acrylate, tetramethylolmethane tetra(meth)acrylate, an oligoester (meth)acrylate, 2,2-bis(4-methacryloxyphenyl)propane, diallyl phthalate, triallyl cyanurate, triallyl isocyanurate, or triallyl trimellitate.

The crosslinking agent content preferably ranges from 0.05 to 10 parts by mass, more preferably 0.1 to 5 parts by mass, per 100 parts by mass of the binder resin, in terms of toner fixability and offset resistance.

[Wax]

Wax for use in an embodiment of the present disclosure is not particularly limited. The following are specific examples.

Petroleum wax and derivatives thereof, such as paraffin wax, microcrystalline wax, and petrolatum Montan wax and derivatives thereof Fischer-Tropsch wax and derivatives thereof Polyolefin wax and derivatives thereof, such as polyethylene Natural wax and derivatives thereof, such as carnauba wax and candelilla wax The "derivatives" include oxides, block copolymers with vinyl monomers, and graft modified materials.

Wax for use in an embodiment of the present disclosure may also be an alcohol, such as a higher aliphatic alcohol, a fatty acid, such as stearic acid or palmitic acid, or a compound thereof, an acid amide, an ester, a ketone, a hydrogenated castor oil or a derivative thereof, a plant wax, or an animal wax. These waxes may be used alone or in combination.

The amount of wax to be added preferably ranges from 2.5 to 15 parts by mass, more preferably 3.0 to 10 parts by mass, per 100 parts by mass of the binder resin. 2.5 parts or more by mass of wax makes oilless fixing easier. 15 parts or less by mass of wax can prevent a wax component excess on the surface of toner particles that affects the charging characteristics of the toner.

[Colorant]

The colorant for use in a toner according to an embodiment of the present disclosure may be a coloring compound or a mixture of coloring compounds represented by the general formula (1). If necessary, another coloring compound may also be used.

Another coloring compound used in combination is not particularly limited. Specific examples of another coloring compound include condensed azo compounds, azo metallic complexes, diketopyrrolopyrrole compounds, anthraquinone compounds, quinacridone compounds, basic dye lake compounds, naphthol compounds, benzimidazolone compounds, thioindigo compounds, perylene compounds, methine compounds, and allylamide compounds.

The colorant content preferably ranges from 1 to 20 parts by mass per 100 parts by mass of the binder resin in the toner.

[Charge Control Agent]

A toner according to an embodiment of the present disclosure may contain a charge control agent, if necessary. The charge control agent can optimize the triboelectric charging amount for each development system.

The charge control agent may be a known charge control agent, particularly a charge control agent that has a high charging speed and that can stably maintain a certain amount of electrical charge. Furthermore, when the toner is produced by a direct polymerization method, the charge control agent can have small polymerization inhibition effects and can be substantially free of substances soluble in an aqueous dispersion medium.

Examples of the charge control agent include, but are not limited to, agents that control negatively charged toner, such as polymers and copolymers with a sulfonic acid group, a sulfonic acid salt group, or a sulfonic ester group, salicylic acid derivatives and metallic complexes thereof, monoazo metallic compounds, acetylacetone metallic compounds, aromatic oxycarboxylic acids, aromatic mono and polycarboxylic acids and metal salts, anhydrides, and esters thereof, phenol derivatives, such as bisphenols, urea derivatives, metal-containing naphthoic acid compounds, boron compounds, quaternary ammonium salts, calixarenes, and resin-based charge control agents.

Examples of the charge control agent also include, but are not limited to, agents that control positively charged toner, such as nigrosine and nigrosine modified with fatty acid metal salts, guanidine compounds, imidazole compounds, onium salts, for example, quaternary ammonium salts, such as tributylbenzylammonium-1-hydroxy-4-naphthosulfonate and tetrabutylammonium tetrafluoroborate, and their analogs, such as phosphonium salts, and lake pigments thereof, triphenylmethane dyes and lake pigments thereof (examples of laking agents include, but are not limited to, phosphotungstic acid, phosphomolybdic acid, phosphotungstenmolybdic acid, tannic acid, lauric acid, gallic acid, ferricyanide, and ferrocyanide), higher fatty acid metal salts, diorganotin oxides, such as dibutyltin oxide, dioctyltin oxide, and dicyclohexyltin oxide, diorganotin borates, such as dibutyltin borate, dioctyltin borate, and dicyclohexyltin borate, and resin-based charge control agents. These charge control agents may be used alone or in combination.

[Fluidizer]

A toner according to an embodiment of the present disclosure may contain an inorganic fine powder externally added as a fluidizer. Examples of the inorganic fine powder include, but are not limited to, silica, titanium oxide, alumina, multiple oxides thereof, and surface-treated powders thereof.

[Particle Size and Circularity of Toner]

A toner according to an embodiment of the present disclosure preferably has a weight-average particle diameter D4 in the range of 4.0 to 9.0 μm, more preferably 4.9 to 7.5 μm, and the ratio of the weight-average particle diameter D4 to the number-average particle diameter D1 (hereinafter referred to as the weight-average particle diameter D4/number-average particle diameter D1 or D4/D1) is preferably 1.35 or less, more preferably 1.30 or less. An increased number of toner particles with a weight-average particle diameter D4 of less than 4.0 μm makes it difficult to stabilize charging in an electrophotography development system, thus often resulting in image degradation, such as image fogging or development stripes, in continuous development (durable operation) of many sheets. In particular, this tendency becomes more pronounced when the number of fine particles of 2.5 μm or less increases. An increased number of toner particles with a weight-average particle diameter D4 of more than 8.0 μm undesirably results in very low reproducibility in a halftone and a rough image. A D4/D1 of more than 1.35 results in fogging, low transferability, and considerable variations in the linewidth of narrow lines (hereinafter referred to as low sharpness).

The number-average particle diameter (D1) and the weight-average particle diameter (D4) of the toner are measured in a particle size distribution analysis by a coulter method. The measuring apparatus is Coulter Counter TA-II or Coulter Multisizer II (manufactured by Beckman Coulter, Inc.). Measurement is performed according to the operations manual of the apparatus. The electrolyte solution is an approximately 1% aqueous sodium chloride prepared from extra pure sodium chloride. For example, ISOTON-II (manufactured by Coulter Scientific Japan) can be used. In a specific measurement method, 0.1 to 5 ml of a surfactant (such as an alkylbenzene sulfonate) is added as a dispersant to 100 to 150 ml of the aqueous electrolyte, and then 2 to 20 mg of a specimen (toner particles) is added to the aqueous electrolyte. The electrolyte solution in which the specimen is suspended is dispersed with an ultrasonic homogenizer for approximately 1 to 3 minutes. The volume and number of toner particles of 2.00 μm or more in the dispersed liquid are measured with the measuring apparatus with 100-μm apertures to calculate the volume distribution and number distribution of the toner. The number-average particle diameter (D1), the weight-average particle diameter (D4) (the median in each channel is taken as a measure of central tendency in each channel), and D4/D1 of the toner are determined.

13 channels are used: 2.00 to 2.52 μm, 2.52 to 3.17 μm, 3.17 to 4.00 μm, 4.00 to 5.04 μm, 5.04 to 6.35 μm, 6.35 to 8.00 μm, 8.00 to 10.08 μm, 10.08 to 12.70 μm, 12.70 to 16.00 μm, 16.00 to 20.20 μm, 20.20 to 25.40 μm, 25.40 to 32.00 μm, and 32.00 to 40.30 μm.

The average circularity of a toner according to an embodiment of the present disclosure measured with a flow particle image analyzer preferably ranges from 0.93 to 0.99, more preferably 0.96 to 0.99, in terms of the transferability of the toner.

The average circularity of the toner is calculated as the arithmetic mean of circularity (=the perimeter of a circle having the same area as the particle projected area/the perimeter of a particle projection image) measured with a flow particle image analyzer "FPIA-2100" (manufactured by SYSMEX Corporation).

The term "particle projected area", as used herein, refers to the binarized area of a toner particle image. The term "perimeter of a particle projection image", as used herein, refers to the contour length of the edge points of the toner particle image. The circularity is a measure of the unevenness of a particle. The circularity of a completely spherical particle is 1.000. The circularity decreases as the surface profile becomes more complicated.

[Production Method]

The production method of the toner will be described below. The toner may be produced by a known method, such as a pulverization method, a suspension polymerization method, a suspension granulation method, an emulsion polymerization method, or an emulsion aggregation method. In particular, the toner can be produced by a granulation method in an aqueous medium, such as a suspension polymerization method or a suspension granulation method, in view of environmental load and particle size controllability in the production.

A toner according to an embodiment of the present disclosure can also be used in a developing agent for use in a liquid development method (hereinafter referred to as a liquid developing agent).

<Ink>

An ink according to an embodiment of the present disclosure will be described below.

Due to its high optical density and light resistance, a coloring compound with a structure represented by the general formula (1) is also suitable for an ink colorant.

An ink according to an embodiment of the present disclosure contains a medium and a coloring compound with a structure represented by the general formula (1).

The other components of an ink according to an embodiment of the present disclosure are selected in accordance with the intended use of the ink. An additive that does not adversely affect the characteristics in various applications of the ink may be added to the ink.

An ink according to an embodiment of the present disclosure may be suitable for an ink jet ink, a printing ink, a coating solution, or a writing ink. In particular, the ink may be suitable for a color filter resist or a thermal transfer recording sheet, as described later.

An ink according to an embodiment of the present disclosure can be produced as described below.

A coloring compound according to an embodiment of the present disclosure, together with another optional colorant, emulsifier, and/or resin, is gradually added to and blended well with a medium with stirring. Furthermore, stable dissolution or fine dispersion under mechanical shear force with a dispersing apparatus produces an ink according to an embodiment of the present disclosure.

The term "medium", as used herein, refers to water or an organic solvent.

In the case where the "medium" is an organic solvent, the type of organic solvent is not particularly limited and depends on the intended use of the colorant.

More specifically, the medium may be an alcohol, such as methanol, ethanol, modified ethanol, isopropanol, n-butanol, isobutanol, tert-butanol, sec-butanol, 2-methyl-2-butanol, 3-pentanol, octanol, benzyl alcohol, or cyclohexanol, a glycol, such as methyl cellosolve, ethyl cellosolve, diethylene glycol, or diethylene glycol monobutyl ether, a ketone, such as acetone, methyl ethyl ketone, or methyl isobutyl ketone, an ester, such as ethyl acetate, butyl acetate, ethyl propionate, or cellosolve acetate, an aliphatic hydrocarbon, such as hexane, octane, petroleum ether, or cyclohexane, an aromatic hydrocarbon, such as benzene, toluene, or xylene, a halogenated hydrocarbon, such as carbon tetrachloride, trichloroethylene, or tetrabromoethane, an ether, such as diethyl ether, dimethyl glycol, trioxane, or tetrahydrofuran, an acetal, such as methylal or diethylacetal, an organic acid, such as formic acid, acetic acid, or propionic acid, or an organic compound containing sulfur or nitrogen, such as nitrobenzene, dimethylamine, monoethanolamine, pyridine, dimethyl sulfoxide, or dimethylformamide.

A polymerizable monomer may be used as the organic solvent. The polymerizable monomer is an addition polymerizable monomer or a condensation polymerizable monomer and can be an addition polymerizable monomer.

Such a polymerizable monomer may be a styrene monomer, an acrylate monomer, a methacrylate monomer, an olefin monomer, a vinyl halide monomer, a vinyl ether monomer, or a vinyl ketone monomer.

Specific examples of the styrene monomer include, but are not limited to, styrene, α-methylstyrene, α-ethylstyrene, o-methylstyrene, m-methylstyrene, p-methylstyrene, o-ethylstyrene, m-ethylstyrene, and p-ethylstyrene.

Specific examples of the acrylate monomer include, but are not limited to, methyl acrylate, ethyl acrylate, propyl acrylate, butyl acrylate, octyl acrylate, dodecyl acrylate, stearyl acrylate, behenyl acrylate, 2-ethylhexyl acrylate, dimethylaminoethyl acrylate, diethylaminoethyl acrylate, acrylonitrile, and acrylamide.

Specific examples of the methacrylate monomer include, but are not limited to, methyl methacrylate, ethyl methacrylate, propyl methacrylate, butyl methacrylate, octyl methacrylate, dodecyl methacrylate, stearyl methacrylate, behenyl methacrylate, 2-ethylhexyl methacrylate, dimethylaminoethyl methacrylate, diethylaminoethyl methacrylate, methacrylonitrile, and methacrylamide.

Specific examples of the olefin monomer include, but are not limited to, ethylene, propylene, butylene, butadiene, isoprene, isobutylene, and cyclohexene.

Specific examples of the vinyl halide monomer include, but are not limited to, vinyl chloride, vinylidene chloride, vinyl bromide, and vinyl iodide.

Specific examples of the vinyl ester monomer include, but are not limited to, vinyl acetate, vinyl propionate, and vinyl benzoate.

Specific examples of the vinyl ether monomer include, but are not limited to, vinyl methyl ether, vinyl ethyl ether, and vinyl isobutyl ether.

Specific examples of the vinyl ketone monomer include, but are not limited to, vinyl methyl ketone, vinyl hexyl ketone, and methyl isopropenyl ketone.

These polymerizable monomers may be used alone or may be used in combination, if necessary.

The colorant in an ink according to an embodiment of the present disclosure may be used in combination with another colorant other than the coloring compounds with a structure represented by the general formula (1). Another colorant may be any colorant that does not adversely affect the solubility or dispersibility of a coloring compound with a structure represented by the general formula (1) in a medium.

Specific examples of another colorant that may be used in combination include, but are not limited to, C.I. Solvent Yellow 1, 19, 44, 49, 62, 74, 77, 79, 81, 82, 83, 89, 90, 93, 98, 103, 104, 112, 120, 121, 151, 153, 154, and 162; C.I. Pigment Yellow 1, 2, 3, 4, 5, 6, 7, 10, 11, 12, 13, 14, 15, 17, 23, 62, 65, 73, 74, 81, 83, 93, 94, 95, 97, 98, 109, 110, 111, 117, 120, 127, 128, 129, 137, 138, 139, 147, 150, 151, 154, 155, 167, 168, 173, 174, 176, 180, 181, 183, and 191, and derivatives thereof.

The colorant content of an ink according to an embodiment of the present disclosure preferably ranges from 1.0 to 30 parts by mass, more preferably 2.0 to 20 parts by mass, still more preferably 3.0 to 15 parts by mass, per 100 parts by mass of a medium. These ranges result in sufficient tinting strength and good colorant dispersibility.

When water is used as a medium for an ink according to an embodiment of the present disclosure, an emulsifier may be added to improve the dispersion stability of the colorant. The emulsifier to be added may be, but is not limited to, a cationic surfactant, an anionic surfactant, or a nonionic surfactant.

Examples of the cationic surfactant include, but are not limited to, dodecylammonium chloride, dodecylammonium bromide, dodecyltrimethylammonium bromide, dodecylpyridinium chloride, dodecylpyridinium bromide, and hexadecyltrimethylammonium bromide.

Examples of the anionic surfactant include, but are not limited to, fatty acid soaps, such as sodium stearate and sodium dodecanoate, sodium dodecyl sulfate, sodium dodecylbenzenesulfonate, and sodium lauryl sulfate.

Examples of the nonionic surfactant include, but are not limited to, dodecyl polyoxyethylene ether, hexadecyl polyoxyethylene ether, nonylphenyl polyoxyethylene ether, lauryl polyoxyethylene ether, sorbitan monooleate polyoxyethylene ether, and monodecanoyl sucrose.

An ink according to an embodiment of the present disclosure may further contain a resin. The type of resin for use in an ink according to an embodiment of the present disclosure is not particularly limited and depends on the intended use. More specifically, the resin may be a polystyrene resin, a styrene copolymer, a polyacrylic acid resin, a poly(methacrylic acid) resin, a polyacrylate resin, a polymethacrylate resin, an acrylic acid copolymer, a methacrylic acid copolymer, a polyester resin, a poly(vinyl ether) resin, a poly(vinyl methyl ether) resin, a poly(vinyl alcohol) resin, a poly(vinyl butyral) resin, a polyurethane resin, or a polypeptide resin. These resins may be used alone or in combination.

<Thermal Transfer Recording Sheet>

A thermal transfer recording sheet according to an embodiment of the present disclosure will be described below.

A coloring compound according to an embodiment of the present disclosure with high optical density and light resistance is suitable for a thermal transfer recording sheet.

A thermal transfer recording sheet according to an embodiment of the present disclosure includes a substrate and a coloring material layer containing a coloring compound represented by the general formula (1) on the substrate.

A thermal transfer recording sheet according to an embodiment of the present disclosure can be produced as described below. A colorant containing a coloring compound with a structure represented by the general formula (1), a binder resin, an optional surfactant, and an optional wax are gradually added to and blended well with a medium with stirring. Furthermore, stable dissolution or fine dispersion of the composition under mechanical shear force with a dispersing apparatus produces an ink according to an embodiment of the present disclosure. The ink is then applied to a base film substrate and is dried to form a thermal transfer recording sheet according to an embodiment of the present disclosure. A thermal transfer recording sheet according to an embodiment of the present disclosure only needs to contain a coloring compound with a structure represented by the general formula (1) and is not limited to a thermal transfer recording sheet produced by this production method.

Various binder resins may be used in a thermal transfer recording sheet according to an embodiment of the present disclosure. Examples of the binder resins include, but are not limited to, water-soluble resins, such as cellulose resins, polyacrylic acid resins, starch resins, and epoxy resins, and organic solvent soluble resins, such as polyacrylate resins, polymethacrylate resins, polystyrene resins, polycarbonate resins, polyethersulfone resins, poly(vinyl butyral) resins, ethylcellulose resins, acetylcellulose resins, polyester resins, AS resins, and phenoxy resins. These resins may be used alone or in combination.

In order to obtain desired spectral characteristics, a thermal transfer recording sheet according to an embodiment of the present disclosure may contain another colorant for tone adjustment. The other colorant to be combined may be any colorant that does not significantly affect the optical density and light resistance of a thermal transfer recording sheet according to an embodiment of the present disclosure, for example, C.I. Solvent Yellow 1, 19, 44, 49, 62, 74, 77, 79, 81, 82, 83, 89, 90, 93, 98, 103, 104, 112, 120, 121, 151, 153, 154, or 162, or a derivative thereof.

The mass ratio of the binder resin to the colorant (binder resin:colorant) preferably ranges from 1:2 to 2:1 in terms of transferability.

In order to provide a thermal transfer recording sheet according to an embodiment of the present disclosure with sufficient lubricity during thermal head heating (printing), a surfactant may be added to the thermal transfer recording sheet. The surfactant may be a cationic surfactant, an anionic surfactant, or a nonionic surfactant.

Examples of the cationic surfactant include, but are not limited to, dodecylammonium chloride, dodecylammonium bromide, dodecyltrimethylammonium bromide, dodecylpyridinium chloride, dodecylpyridinium bromide, and hexadecyltrimethylammonium bromide.

Examples of the anionic surfactant include, but are not limited to, fatty acid soaps, such as sodium stearate and sodium dodecanoate, sodium dodecyl sulfate, sodium dodecylbenzenesulfonate, and sodium lauryl sulfate.

Examples of the nonionic surfactant include, but are not limited to, dodecyl polyoxyethylene ether, hexadecyl polyoxyethylene ether, nonylphenyl polyoxyethylene ether, lauryl polyoxyethylene ether, sorbitan monooleate polyoxyethylene ether, and monodecanoyl sucrose.

In order to provide a thermal transfer recording sheet according to an embodiment of the present disclosure with sufficient lubricity while a thermal head is not heated, a wax may be added to the thermal transfer recording sheet. The wax may be, but is not limited to, a polyethylene wax, a paraffin wax, or a fatty acid ester wax.

In addition to the additives described above, if necessary, an ultraviolet absorber, a preservative, an antioxidant, an antistatic agent, and/or a viscosity modifier may be added to a thermal transfer recording sheet according to an embodiment of the present disclosure.

The substrate for use in a thermal transfer recording sheet according to an embodiment of the present disclosure may be, but is not limited to, a substrate with high heat resistance, for example, heat-resistant capacitor paper, thin paper, such as glassine paper, or a plastic film, such as a polyester, polycarbonate, polyamide, polyimide, or polyaramid film. In particular, a poly(ethylene terephthalate) film has high mechanical strength, solvent resistance, and economic viability. The substrate preferably has a thickness in the range of 3 to 50 µm in terms of transferability.

In order to improve the heat resistance of a thermal transfer recording sheet according to an embodiment of the present disclosure and the traveling of a thermal head, a layer of a lubricant, lubricating heat-resistant fine particles, or a heat-resistant resin, such as a binder, may be formed on a surface of the substrate opposite the coloring material layer. The lubricant may be an amino-modified silicone compound or a carboxy-modified silicone compound. The heat-resistant fine particles may be, but are not limited to, silica fine particles. The binder may be, but is not limited to, an acrylic resin.

<Color Filter Resist Composition>

A color filter resist composition according to an embodiment of the present disclosure will be described below.

A coloring compound according to an embodiment of the present disclosure is suitable for a color filter resist composition.

A color filter resist composition according to an embodiment of the present disclosure contains a binder resin, a medium, and a coloring compound represented by the formula (1).

A color filter resist composition according to an embodiment of the present disclosure can be produced as described below. The coloring compound and a binder resin are added to a medium with stirring. If necessary, a polymerizable monomer, a polymerization initiator, and/or a photoacid generator may be added to the medium. Subsequently, stable dissolution or fine dispersion of the materials in the medium under mechanical shear force with a dispersing apparatus produces a color filter resist composition according to an embodiment of the present disclosure.

In a light exposure process for forming pixels, a light-irradiated portion or an unirradiated portion of a binder resin used in a color filter resist composition according to an embodiment of the present disclosure is soluble in an organic solvent, an alkaline aqueous solution, water, or a commercially available developer. In particular, the binder resin can be developed by water or an alkaline aqueous solution, from the perspective of workability and treatment after the formation of the resist.

The binder resin can be produced by the copolymerization of a hydrophilic polymerizable monomer and a lipophilic polymerizable monomer at an appropriate mixing ratio by a known technique.

Examples of the hydrophilic polymerizable monomer include, but are not limited to, acrylic acid, methacrylic acid, N-(2-hydroxyethyl)acrylamide, N-vinylpyrrolidone, and polymerizable monomers with an ammonium salt. Specific examples of the lipophilic polymerizable monomer include, but are not limited to, acrylates, methacrylates, vinyl acetate, styrene, and N-vinylcarbazole.

The solubility of an exposed portion of these binder resins in a developer is decreased by a combination of a radical polymerizable monomer having an ethylenically unsaturated group, a cation polymerizable monomer having an oxirane ring or an oxetane ring, a radical generator, an acid generator, and a base generator. Thus, these binder resins can be used as negative resists, in which only an unexposed portion is removed by development.

A resin with a quinonediazide group that is cleaved by light and forms a carboxy group, a tert-butyl carbonate of polyhydroxystyrene, a binder resin with a group that is cleaved by an acid, exemplified by tetrahydropyranyl ether, and an acid generator that generates an acid upon exposure to light may also be combined. A resin of this type can be used as a positive resist. The solubility of an exposed portion of the positive resist in a developer is increased by light exposure, and only the exposed portion is removed by development.

In the case where a color filter resist composition according to an embodiment of the present disclosure is a negative resist composition, a polymerizable monomer that undergoes addition polymerization upon exposure to light can be used (hereinafter also referred to as a photopolymerizable monomer). The photopolymerizable monomer can have in its molecule at least one ethylenically unsaturated double bond capable of addition polymerization and have a boiling point of 100° C. or more at atmospheric pressure. More specifically, the photopolymerizable monomer may be a monofunctional acrylate, such as polyethylene glycol monoacrylate, polyethylene glycol monomethacrylate, polypropylene glycol monoacrylate, polypropylene glycol monomethacrylate, phenoxyethyl acrylate, or phenoxyethyl methacrylate; a polyfunctional acrylate or methacrylate, such as poly(ethylene glycol) diacrylate, poly(ethylene glycol) dimethacrylate, poly(propylene glycol) diacrylate, poly(propylene glycol) dimethacrylate, trimethylolethane triacrylate, trimethylolethane trimethacrylate, trimethylolpropane triacrylate, trimethylolpropane trimethacrylate, trimethylolpropane diacrylate, trimethylolpropane dimethacrylate, neopentyl glycol diacrylate, neopentyl glycol dimethacrylate, pentaerythritol tetraacrylate, pentaerythritol tetramethacrylate, pentaerythritol triacrylate, pentaerythritol trimethacrylate, dipentaerythritol hexaacrylate, dipentaerythritol hexamethacrylate, dipentaerythritol pentaacrylate, dipentaerythritol pentamethacrylate, hexanediol diacrylate, hexanediol dimethacrylate, trimethylolpropane tri(acryloyloxypropyl) ether, tri(acryloyloxyethyl) isocyanurate, tri(acryloyloxyethyl) cyanurate, glycerin triacrylate, or glycerin trimethacrylate; or a polyfunctional acrylate or polyfunctional methacrylate, produced by the addition of ethylene oxide or propylene oxide to a polyfunctional alcohol, such as trimethylolpropane or glycerin, followed by acrylation or methacrylation. The photopolymerizable monomer may also be a urethane acrylate, a polyester acrylate, or a polyfunctional epoxy acrylate or methacrylate, which is a reaction product of an epoxy resin and acrylic acid or methacrylic acid. In particular, trimethylolpropane triacrylate, trimethylolpropane trimethacrylate, pentaerythritol tetraacrylate, pentaerythritol tetramethacrylate, dipentaerythritol hexaacrylate, dipentaerythritol hexamethacrylate, dipentaerythritol pentaacrylate, or dipentaerythritol pentamethacrylate can be used.

These photopolymerizable monomers may be used alone or in combination.

The photopolymerizable monomer content preferably ranges from 5% to 50% by mass, more preferably 10% to 40% by mass, of the mass (total solids) of a resist composition according to an embodiment of the present disclosure. A photopolymerizable monomer content in the range of 5% to 50% by mass results in improved sensitivity to light exposure, improved pixel intensity, and appropriate adhesiveness of the resist composition.

In the case where a color filter resist composition according to an embodiment of the present disclosure is a negative resist composition, a photopolymerization initiator may be added to the color filter resist composition. The photopolymerization initiator may be a vicinal polyketaldonyl compound, an α-carbonyl compound, an acyloin ether, a branched quinone compound, a combination of a triallylimidazole dimer and p-aminophenyl ketone, or a trioxadiazole compound. In particular, 2-benzyl-2-dimethylamino-1-(4-morpholinophenyl)butanone (trade name: Irgacure 369, manufactured by BASF) can be used. When an electron beam is used to form a pixel using a coloring resist according to an embodiment of the present disclosure, the photopolymerization initiator is not necessary.

In the case where a color filter resist composition according to an embodiment of the present disclosure is a positive resist composition, a photoacid generator may be added to the color filter resist composition, if necessary. The photoacid generator may be a known photoacid generator, for example, a salt of an anion and an onium ion, such as sulfonium, iodonium, selenium, ammonium, or phosphonium.

The sulfonium ion may be triphenylsulfonium, tri-p-tolylsulfonium, tri-o-tolylsulfonium, tris(4-methoxyphenyl)sulfonium, 1-naphthyldiphenylsulfonium, diphenylphenacylsulfonium, phenylmethylbenzylsulfonium, 4-hydroxyphenylmethylbenzylsulfonium, dimethylphenacylsulfonium, or phenacyltetrahydrothiophenium.

The iodonium ion may be diphenyliodonium, di-p-tolyliodonium, bis(4-dodecylphenyl)iodonium, bis(4-methoxyphenyl)iodonium, or (4-octyloxyphenyl)phenyliodonium.

The selenium ion may be triarylselenium (triphenylselenium, tri-p-tolylselenium, tri-o-tolylselenium, tris(4-methoxyphenyl)selenium, 1-naphthyldiphenylselenium, tris(4-fluorophenyl)selenium, tri-1-naphthylselenium, or tri-2-naphthylselenium.

The ammonium ion may be a tetraalkylammonium (tetramethylammonium, ethyltrimethylammonium, diethyldimethylammonium, triethylmethylammonium, tetraethylammonium, trimethyl-n-propylammonium, trimethylisopropylammonium, trimethyl-n-butylammonium, or trimethylisobutylammonium).

The phosphonium ion may be tetraphenylphosphonium, tetra-p-tolylphosphonium, tetrakis(2-methoxyphenyl)phosphonium, triphenylbenzylphosphonium, triphenylphenacylphosphonium, triphenylmethylphosphonium, triethylbenzylphosphonium, or tetraethylphosphonium.

The anion may be, but is not limited to, a perhalogen acid ion, such as $ClO_4^-$ or $BrO_4^-$, a halogenated sulfonate ion, such as $FSO_3^-$ or $ClSO_3^-$, a sulfate ion, such as $CH_3SO_4^-$, $CF_3SO_4^-$, or $HSO_4^-$, a carbonate ion, such as $HCO_3^-$ or $CH_3CO_3^-$, an aluminate ion, such as $AlCl_4^-$ or $AlF_4^-$, a carboxylate ion, such as a hexafluorobismuthate ion, $CH_3COO^-$, $CF_3COO^-$, $C_6H_5COO^-$, $CH_3C_6H_4COO^-$, $C_6F_5COO^-$, or $CF_3C_6H_4COO^-$, an arylborate ion, such as $B(C_6H_5)_4^-$ or $CH_3CH_2CH_2CH_2B(C_6H_5)_3^-$, a thiocyanate ion, or a nitrate ion.

The medium of a color filter resist composition according to an embodiment of the present disclosure in which the coloring compound, a binder resin, and, if necessary, a photopolymerizable monomer, a photopolymerization initiator, and a photoacid generator are dissolved or dispersed may be water or an organic solvent. The organic solvent may be cyclohexanone, ethyl cellosolve acetate, butyl cellosolve acetate, 1-methoxy-2-propylacetate, diethylene glycol dimethyl ether, ethylbenzene, 1,2,4-trichlorobenzene, ethylene glycol diethyl ether, xylene, ethyl cellosolve, methyl-n-amyl ketone, propylene glycol monomethyl ether, toluene, methyl ethyl ketone, ethyl acetate, methanol, ethanol, isopropanol, butanol, methyl isobutyl ketone, or a petroleum solvent. These solvents may be used alone or in combination. Unless the medium of a color filter resist composition according to an embodiment of the present disclosure adversely affects the dispersibility of the coloring compound, the medium may be the same as or different from the medium used in combination with the coloring compound.

In order to obtain desired spectral characteristics, a color filter according to an embodiment of the present disclosure may contain another dye for tone adjustment. The dye may be, but is not limited to, C.I. Solvent Blue 14, 24, 25, 26, 34, 37, 38, 39, 42, 43, 44, 45, 48, 52, 53, 55, 59, 67, or 70; or C.I. Solvent Red 8, 27, 35, 36, 37, 38, 39, 40, 49, 58, 60, 65, 69, 81, 83:1, 86, 89, 91, 92, 97, 99, 100, 109, 118, 119, 122, 127, or 218.

In addition to the additives described above, if necessary, an ultraviolet absorber and/or a silane coupling agent for improving adhesion to a glass substrate in the production of a filter may be added to a color filter resist composition according to an embodiment of the present disclosure.

EXAMPLES

Although the present disclosure will be further described in the following exemplary embodiments and comparative examples, the present disclosure is not limited to these exemplary embodiments. Unless otherwise specified, the terms "part" and "%" are based on mass. The reaction products were identified with a $^1H$ nuclear magnetic resonance ($^1H$-NMR) spectrometer (ECA-400 manufactured by JEOL Ltd.).

[Production of Coloring Compound with Structure Represented by General Formula (1)]

A coloring compound with a structure represented by the general formula (1) according to an embodiment of the present disclosure can be synthesized with reference to a known method.

A coloring compound with a structure represented by the general formula (1) according to an embodiment of the present disclosure was produced by the following method.

<Exemplary Emodiment 1: Production of Compound (5)>

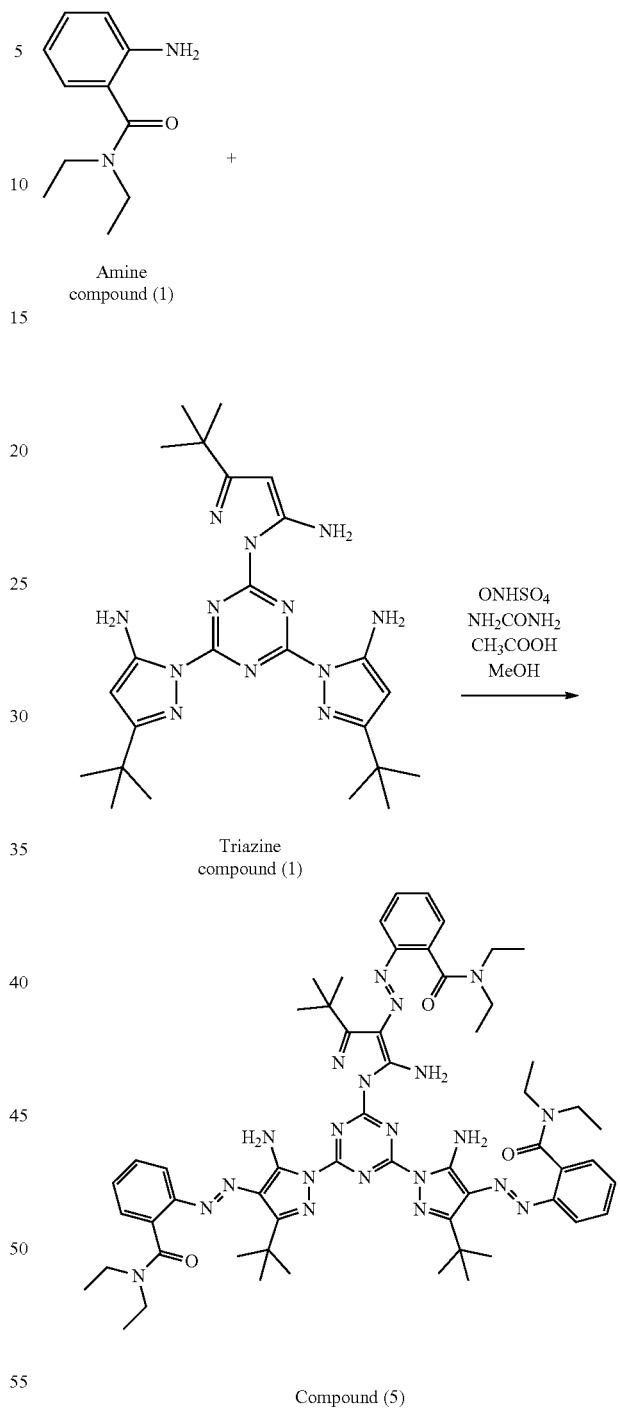

A solution of 1.18 g of an amine compound (1) in 7.5 g of acetic acid was cooled to 10° C., and 2.2 g of 40% nitrosylsulfuric acid solution was added dropwise. 0.12 g of urea was added stepwise to the solution (diazotized A solution). Separately, a solution of 0.98 g of a triazine compound (1) in 30 g of methanol was cooled to 10° C. The diazotized A solution was slowly added dropwise to the solution in such a manner as to maintain the temperature at 10° C. or less. The solution was stirred at 10° C. for another one hour. After the completion of the reaction, aqueous sodium carbonate was added dropwise to neutralize the solution to pH 6. A precipitated solid was then filtered and washed with water. The solid was recrystallized in chloroform three times. Thus, 0.4 g of a compound (5) was produced.

[Analysis Results of Compound (5)]

$^1$H-NMR (400 MHz, d-DMSO, at room temperature): δ (ppm)=9.13-8.61 (6H, bd), 7.73 (3H, d), 7.58-7.54 (3H, m), 7.52-7.42 (6H, m), 3.34-3.31 (6H, m), 3.18 (6H, q), 1.56 (27H, s), 1.24 (9H, t), 0.97 (9H, t)

<Exemplary Emodiment 2: Production of Compound (9)>

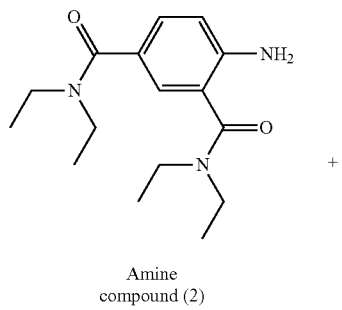

Amine compound (2)

+

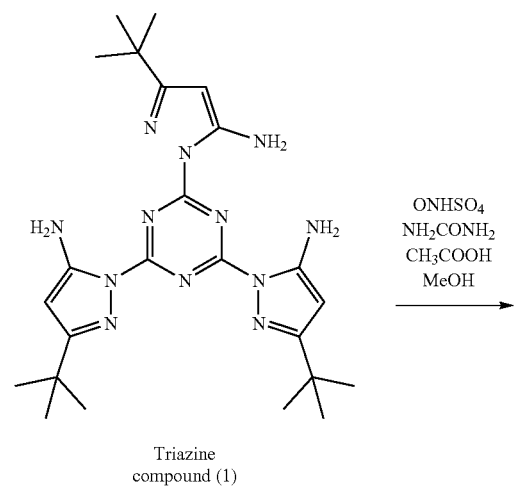

Triazine compound (1)

ONHSO$_4$
NH$_2$CONH$_2$
CH$_3$COOH
MeOH

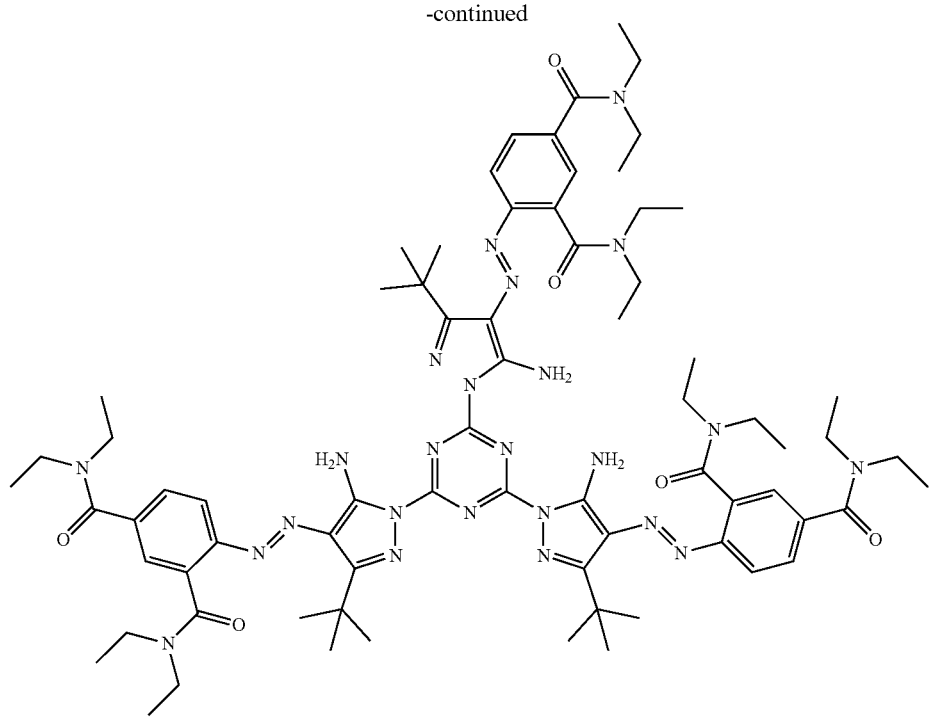
Compound (9)
A compound (9) was produced in the same manner as in Exemplary Embodiment 1 except that the amine compound (1) was replaced by an amine compound (2).
<Exemplary Emodiment 3: Production of Compound (10)>
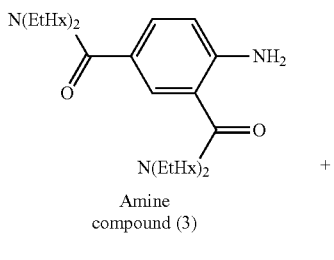
Amine compound (3)
+
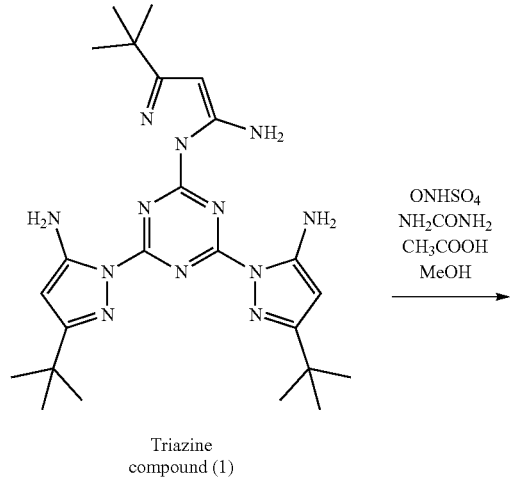
Triazine compound (1)
→ ONHSO$_4$
NH$_2$CONH$_2$
CH$_3$COOH
MeOH -continued

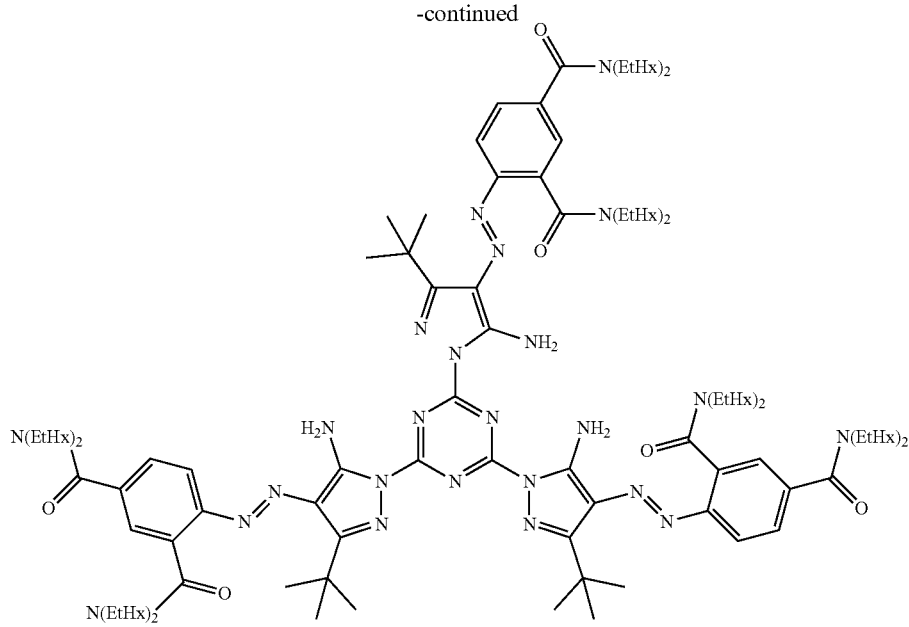

Compound (10)

A compound (10) was produced in the same manner as in Exemplary Embodiment 1 except that the amine compound (1) was replaced by an amine compound (3).

Exemplary Embodiment 4: Production of Compound (11)

A compound (11) was produced in the same manner as in Exemplary Embodiment 1 except that the amine compound (1) was replaced by the following amine compound:

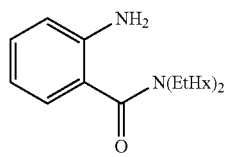

wherein EtHx denotes a 2-ethylhexyl group.

Exemplary Embodiment 5: Production of Compound (14)

A compound (14) was produced in the same manner as in Exemplary Embodiment 1 except that the amine compound (1) was replaced by the following amine compound:

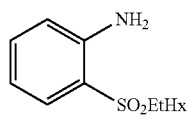

wherein EtHx denotes a 2-ethylhexyl group.

Exemplary Embodiment 6: Production of Compound (15)

A compound (15) was produced in the same manner as in Exemplary Embodiment 1 except that the amine compound (1) was replaced by the following amine compound:

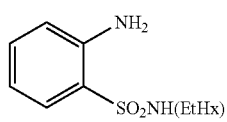

wherein EtHx denotes a 2-ethylhexyl group.

Exemplary Embodiment 7: Production of Compound (16)

A compound (16) was produced in the same manner as in Exemplary Embodiment 1 except that the amine compound (1) was replaced by the following compound:

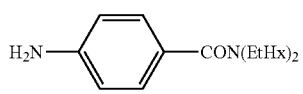

wherein EtHx denotes a 2-ethylhexyl group.

Exemplary Embodiment 8: Production of Compound (20)

A compound (20) was produced in the same manner as in Exemplary Embodiment 1 except that the amine compound (1) was replaced by the following compound:

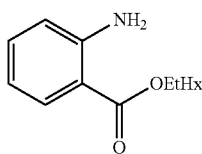

wherein EtHx denotes a 2-ethylhexyl group.

[Production of Yellow Toner]

A yellow toner was produced by the following method.

Exemplary Embodiment A-1

A mixture of 10 parts of the compound (1) and 120 parts of styrene was dissolved with an attritor (manufactured by Mitsui Mining Co., Ltd.) for 3 hours to produce a coloring compound dispersion (1).

710 parts of ion-exchanged water and 450 parts of 0.1 mol/l aqueous trisodium phosphate in a 2-L four-neck flask equipped with a high-speed agitator T.K. homo mixer (manufactured by Primix Corporation) were heated to 60° C. at a rotational speed of 12000 rpm. 68 parts of 1.0 mol/l aqueous calcium chloride was gradually added to the mixture to prepare an aqueous medium containing a fine poorly water-soluble dispersion stabilizer calcium phosphate.

Coloring compound dispersion (1) 130.0 parts
Styrene monomer 46.0 parts
n-Butyl acrylate monomer 34.0 parts
Aluminum salicylate compound 2.0 parts
(Bontron E-88 manufactured by Orient Chemical Industries Co., Ltd.)
Polar resin 10.0 parts
(a polycondensate of propylene-oxide-modified bisphenol A and isophthalic acid, Tg=65° C., Mw=10000, Mn=6000)
Ester wax 25.0 parts
(Temperature of maximum endothermic peak determined by DSC=70° C., Mn=704)

These materials were heated to 60° C. and were homogeneously dissolved or dispersed with the T.K. homo mixer at 5000 rpm. 10 parts of a polymerization initiator 2,2'-azobis(2,4-dimethylvaleronitrile) was dissolved in the mixture to prepare a polymerizable monomer composition.

The polymerizable monomer composition was poured into the aqueous medium and was granulated at a rotational speed of 12000 rpm for 15 minutes. The high-speed agitator was then replaced with an agitator having impeller blades. Polymerization was continued at a liquid temperature of 60° C. for 5 hours and then at 80° C. for 8 hours. After the completion of the polymerization reaction, the residual monomers were removed at 80° C. under reduced pressure. The liquid temperature was cooled to 30° C. Thus, a dispersion of fine polymer particles was produced.

The dispersion of fine polymer particles was transferred to a washing vessel, was adjusted to pH 1.5 by the addition of diluted hydrochloric acid while stirring, and was stirred for 2 hours. The fine polymer particles were collected by solid-liquid separation with a filter. Redispersion of the fine polymer particles in water and solid-liquid separation were repeatedly performed until a compound of phosphoric acid and calcium containing calcium phosphate was sufficiently removed. After the final solid-liquid separation, fine polymer particles were thoroughly dried in a dryer to produce yellow toner base particles (1).

100 parts of the yellow toner base particles were dry blended with
a hydrophobic fine silica powder surface-treated with hexamethyldisilazane (number average diameter of primary particles: 7 nm) 1.00 part,
a rutile titanium oxide fine powder (number average diameter of primary particles: 45 nm) 0.15 parts, and
a rutile titanium oxide fine powder (number average diameter of primary particles: 200 nm) 0.50 parts
in a Henschel mixer (manufactured by Nippon Coke & Engineering Co., Ltd.) for 5 minutes, thus producing a yellow toner (1) according to an embodiment of the present disclosure.

Exemplary Embodiment A-2

A yellow toner (2) according to an embodiment of the present disclosure was produced in the same manner as in Exemplary Embodiment A-1 except that the compound (5) was replaced by 10.5 parts of the compound (10).

Exemplary Embodiment A-3

A yellow toner (3) according to an embodiment of the present disclosure was produced in the same manner as in Exemplary Embodiment A-1 except that the compound (5) was replaced by 11 parts of the compound (14).

Exemplary Embodiment A-4

A yellow toner (4) according to an embodiment of the present disclosure was produced in the same manner as in Exemplary Embodiment A-1 except that the compound (5) was replaced by 12 parts of the compound (16).

Comparative Example A-1

A comparative yellow toner (comparative 1) was produced in the same manner as in Exemplary Embodiment A-1 except that the compound (1) was replaced by the following comparative compound (1).

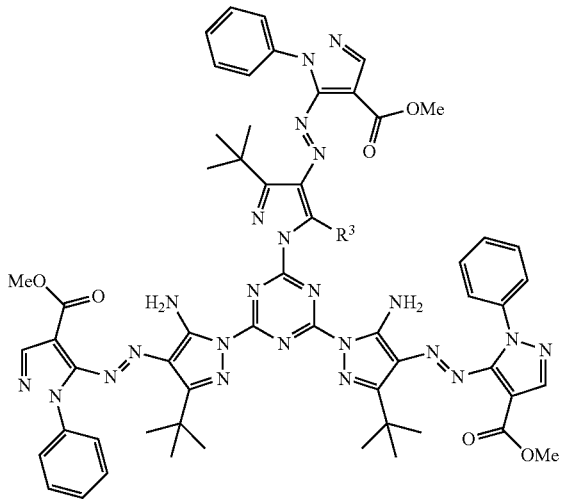

Comparative compound (1)

Exemplary Embodiment A-5

82.6 parts of styrene, 9.2 parts of n-butyl acrylate, 1.3 parts of acrylic acid, 0.4 parts of hexanediol acrylate, and 3.2 parts of n-lauryl mercaptan were mixed and dissolved. An aqueous solution of 1.5 parts of Neogen RK (manufactured by Dai-ichi Kogyo Seiyaku Co., Ltd.) in 150 parts of ion-exchanged water was added to and dispersed in the solution. An aqueous solution of 0.15 parts of potassium persulfate in 10 parts of ion-exchanged water was added to the solution for 10 minutes with gentle stirring. After purged with nitrogen, emulsion polymerization was performed at 70° C. for 6 hours. After the polymerization, the reaction liquid was cooled to room temperature, and ion-exchanged water was added. Thus, a resin particle dispersion liquid was produced. The resin particle dispersion liquid had a solid content of 12.5% and a median diameter of 0.2 μm on a volume basis.

100 parts of an ester wax (maximum endothermic peak temperature measured by DSC=70° C., Mn=704) and 15 parts of Neogen RK were added to 385 parts of ion-exchanged water and were dispersed with a wet jet mill JN100 (manufactured by Jokoh Co., Ltd.) for approximately 1 hour to produce a wax dispersion liquid. The concentration of the wax particle dispersion liquid was 20%.

100 parts of the compound (5) and 15 parts of Neogen RK were added to 885 parts of ion-exchanged water and were dispersed with the wet jet mill JN100 (manufactured by Jokoh Co., Ltd.) for approximately 1 hour to produce a dispersion liquid of the compound (5).

The median diameter of the colorant particles in the dispersion liquid of the compound (5) was 0.2 μm on a volume basis. The concentration of the dispersion liquid of the compound (5) was 10%.

160 parts of a resin particle dispersion liquid, 10 parts of a wax dispersion liquid, 10 parts of the dispersion liquid of the compound (5), and 0.2 parts of magnesium sulfate were dispersed with a homogenizer (Ultra-Turrax T50 manufactured by IKA) and were heated to 65° C. with stirring. After stirring at 65° C. for 1 hour, optical microscopic observation showed the formation of agglomerate with an average particle diameter of approximately 6.0 μm. After the addition of 2.2 parts of Neogen RK (manufactured by Dai-ichi Kogyo Seiyaku Co., Ltd.), heating to 80° C. and stirring for 120 minutes produced fused spherical particles. After cooling and filtration, the filtered solid was stirred in and washed with 720 parts of ion-exchanged water for 60 minutes. After the solution containing the particles was filtered, such washing was repeated until the electrical conductivity of the filtrate reached 150 μS/cm or less. The particles were dried with a vacuum dryer to produce toner base particles (5).

100 parts of the toner base particles (5) were dry-blended in a Henschel mixer (manufactured by Mitsui Mining Co., Ltd.) with 1.8 parts of a fine silica powder subjected to hydrophobic treatment to produce a yellow toner (5). The fine silica powder had a BET specific surface area of 200 m$^2$/g.

Exemplary Embodiment A-6

A yellow toner (6) according to an embodiment of the present disclosure was produced in the same manner as in Exemplary Embodiment A-5 except that the compound (5) was replaced by the compound (15).

Comparative Example A-2

A comparative yellow toner (comparative 2) was produced in the same manner as in Exemplary Embodiment A-5 except that the compound (5) was replaced by the comparative compound (1).

Exemplary Embodiment A-7

Binder resin (polyester resin): 100 parts
(Tg 55° C., acid value 20 mgKOH/g, hydroxyl value 16 mgKOH/g, molecular weight: Mp 4500, Mn 2300, Mw 38000)
Compound (9): 5 parts
Aluminum 1,4-di-t-butyl salicylate compound: 0.5 parts
Paraffin wax (maximum endothermic peak temperature 78° C.): 5 parts These materials were thoroughly mixed in a Henschel mixer (FM-75J manufactured by Mitsui Mining Co., Ltd.) and were then kneaded in a twin-screw kneader (PCM-45 manufactured by Ikegai Corporation) at a temperature of 130° C. and at a feed rate of 60 kg/h (the discharge temperature was approximately 150° C.). The kneaded product was cooled, was crushed in a hammer mill, and was pulverized in a mechanical grinder (T-250 manufactured by Turbo Kogyo Co., Ltd.) at a feed rate of 20 kg/h.

The ground product was classified with a multi-division classifier utilizing the Coanda effect to produce toner base particles (7).

100 parts of the toner base particles (7) were dry-blended in a Henschel mixer (manufactured by Mitsui Mining Co., Ltd.) with 1.8 parts of a fine silica powder subjected to hydrophobic treatment to produce a yellow toner (7). The fine silica powder had a BET specific surface area of 200 m$^2$/g.

Exemplary Embodiment A-8

A yellow toner (8) according to an embodiment of the present disclosure was produced in the same manner as in Exemplary Embodiment A-7 except that the compound (9) was replaced by the compound (11).

Exemplary Embodiment A-9

A yellow toner (9) according to an embodiment of the present disclosure was produced in the same manner as in Exemplary Embodiment A-7 except that the compound (9) was replaced by the compound (20).

Comparative Example A-3

A yellow toner (comparative 3) was produced in the same manner as in Exemplary Embodiment A-7 except that the compound (9) was replaced by the comparative compound (1).

<Evaluation>

The yellow toners (1) to (9) and the yellow toners (comparative 1) to (comparative 3) were used to output image samples, and the image characteristics described later were compared. A modified LBP-5300 (manufactured by CANON KABUSHIKI KAISHA) was used as an image-forming apparatus (hereinafter referred to as LBP) to compare the image characteristics. The modification included the replacement of a developing blade in a process cartridge (hereinafter referred to as CRG) with a stainless steel blade 8 μm in thickness. Furthermore, a blade bias of −200 V could be applied relative to a developing bias applied to a developing roller, which is a toner carrier.

In the evaluation, a CRG charged with each of the yellow toners was prepared for each evaluation item.

<Measurement of Color Saturation>

An image sample with a maximum toner coverage of 0.45 mg/cm² was produced with the image-forming apparatus in the normal environment (temperature 25° C./humidity 60% RH). The base paper of the image sample was a CLC color copy paper (manufactured by CANON KABUSHIKI KAISHA). The chromaticity (L*, a*, b*) of the image sample based on the L*a*b* color system was measured with SpectroLino (manufactured by Gretag Macbeth). The color saturation (C*) was calculated from the measured value of the color characteristics using the following formula.

$$C^* = \sqrt{(a^*)^2 + (b^*)^2}$$

A higher color saturation C* at the same amount of colorant per unit area is rated higher. The color saturation C* of the image sample was rated as follows:

A: C* of 85 or more (very good color saturation),

B: C* of 80 or more and less than 85 (good color saturation), and

C: C* of less than 80 (poor color saturation).

Table 1 shows the results.

TABLE 1

| Toner No. | Compound | Production method | Weight-average particle diameter D4 (μm) | D4/D1 | Average circularity | Color Saturation/rating |
|---|---|---|---|---|---|---|
| Example A-1 | Compound (5) | Suspension polymerization | 6.02 | 1.24 | 0.96 | 88/A |
| Example A-2 | Compound (10) | Suspension polymerization | 5.89 | 1.19 | 0.93 | 86/A |
| Example A-3 | Compound (14) | Suspension polymerization | 5.68 | 1.15 | 0.93 | 86/A |
| Example A-4 | Compound (16) | Suspension polymerization | 5.13 | 1.24 | 0.94 | 84/B |
| Example A-5 | Compound (5) | Emulsion aggregation | 5.85 | 1.12 | 0.97 | 90/A |
| Example A-6 | Compound (15) | Emulsion aggregation | 6.11 | 1.12 | 0.97 | 83/B |
| Example A-7 | Compound (9) | Pulverization | — | — | — | 83/B |
| Example A-8 | Compound (11) | Pulverization | — | — | — | 84/B |
| Example A-9 | Compound (20) | Pulverization | — | — | — | 86/A |
| Comparative example A-1 | Comparative compound (1) | Suspension polymerization | 5.78 | 1.34 | 0.95 | 73/C |
| Comparative example A-2 | Comparative compound (1) | Emulsion aggregation | 4.96 | 1.23 | 0.97 | 78/C |
| Comparative example A-3 | Comparative compound (1) | Pulverization | — | — | — | 76/C |

[Production of Ink]

Inks according to embodiments of the present disclosure and comparative inks were produced by the following method.

Exemplary Embodiment B-1

150 parts of the compound (5), which is a coloring compound according to an embodiment of the present disclosure, 350 parts of toluene, 350 parts of ethyl acetate, and 300 parts of 2-butanone were mixed to produce an ink (1) according to an embodiment of the present disclosure.

Exemplary Embodiments B-2 to B-6

Inks (2) to (6) according to embodiments of the present disclosure were produced in the same manner as in Exemplary Embodiment B-1 except that the compound (5) was replaced by the compound (10), (11), (14), (15), or (20).

Comparative Examples B-1 and B-2

Comparative inks (1) and (2) were produced in the same manner as in Exemplary Embodiment B-1 except that the compound (5) was replaced by the comparative compound (1) or the following comparative compound (2).

Comparative compound (2)

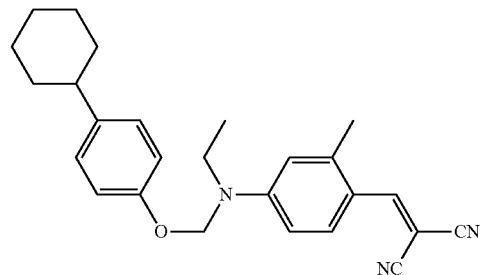

<Evaluation>
[Preparation of Sample]

The inks (1) to (6) and the comparative inks (1) and (2) were applied to a hiding power test paper by a bar coating method (Bar No. 10) and were air-dried overnight to produce image samples.

[Evaluation of Optical Density]

The optical density (OD(Y)) of each image sample was measured with a reflection densitometer SpectroLino (manufactured by Gretag Macbeth). The evaluation criteria were as follows:

A: OD(Y) of 2.0 or more (very high optical density),

B: OD(Y) of 1.5 or more and less than 2.0 (high optical density), and

C: OD(Y) of less than 1.5 (low optical density).

[Evaluation of Light Resistance]

A 50-hour exposure test of each image sample was performed with a xenon test apparatus (Atlas Ci4000, manufactured by Suga Test Instruments Co., Ltd.) under the conditions of illuminance: 0.39 W/m$^2$ at 340 nm, temperature: 40° C., and relative humidity: 60%. The chromaticity (L*, a*, b*) of each image sample based on the L*a*b* color system was measured before and after the test. The color difference ΔE was defined as described below, wherein a*$_0$, b*$_0$, and L*$_0$ represent the initial chromaticity, a*, b*, and L* represent the chromaticity after exposure.

$$\Delta E = \sqrt{(a^* - a^*_0)^2 + (b^* - b^*_0)^2 + (L^* - L^*_0)^2}$$

The evaluation criteria were as follows:

A: ΔE<2.5 (very high light resistance),

B: 2.5≤ΔE<5 (high light resistance), and

C: 5≤ΔE (low light resistance).

Table 2 shows the results for the exemplary embodiments and comparative examples.

TABLE 2

| | Ink | Compound used | OD(Y)/rating | ΔE/rating |
|---|---|---|---|---|
| Example B-1 | Ink (1) | Compound (5) | 2.11/A | 2.52/B |
| Example B-2 | Ink (2) | Compound (10) | 2.34/A | 1.98/A |
| Example B-3 | Ink (3) | Compound (11) | 2.20/A | 1.40/A |
| Example B-4 | Ink (4) | Compound (14) | 2.15/A | 1.31/A |
| Example B-5 | Ink (5) | Compound (15) | 2.08/A | 2.33/A |
| Example B-6 | Ink (6) | Compound (20) | 1.95/B | 3.78/B |
| Comparative example B-1 | Comparative ink (1) | Comparative compound (1) | 1.39/C | 0.90/A |
| Comparative example B-2 | Comparative ink (2) | Comparative compound (2) | 2.53/A | 7.98/C |

[Production of Color Filter Resist Composition]

Exemplary Embodiment C-1

12 parts of the compound (5) and 120 parts of cyclohexanone were mixed and dispersed with an attritor (manufactured by Mitsui Mining Co., Ltd.) for 1 hour to produce a color filter ink.

An acrylic copolymerization composition (weight-average molecular weight Mw: 10,000) composed of 40% by mass of n-butyl methacrylate, 30% by mass of acrylic acid, and 30% by mass of hydroxyethyl methacrylate: 6.7 parts Dipentaerythritol pentaacrylate: 1.3 parts 2-Benzyl-2-dimethylamino-1-(4-morpholinophenyl)-butanone (photopolymerization initiator): 0.4 parts Cyclohexanone: 96 parts These materials were mixed to prepare a solution. 22 parts of the color filter ink was slowly added to the solution, and the solution was stirred at room temperature for 3 hours. The solution was passed through a 1.5-μm filter to produce a color filter resist composition (1) according to the present exemplary embodiment.

The color filter resist composition (1) was applied to a glass substrate by spin coating, was dried at 90° C. for 3 minutes, was subjected to whole surface exposure, and was post-cured at 180° C. Thus, a color filter (1) was produced.

Exemplary Embodiments C-2 and C-3

Color filter resist compositions (2) and (3) were produced in the same manner as in Exemplary Embodiment C-1 except that the compound (5) was replaced by the compound (9) or (14).

Color filters (2) and (3) were produced in the same manner as in Exemplary Embodiment C-1 except that the color filter resist composition (1) was replaced by the color filter resist composition (2) or (3).

Comparative Examples C-1 and C-2

Comparative color filter resist compositions (1) and (2) were produced in the same manner as in Exemplary Embodiment C-1 except that the compound (5) was replaced by the comparative compound (1) or (2).

Comparative color filters (1) and (2) were produced in the same manner as in Exemplary Embodiment C-1 except that the color filter resist composition (1) was replaced by the comparative color filter resist composition (1) or (2).

[Production of Thermal Transfer Recording Sheet]

Exemplary Embodiment D-1

13.5 parts of the compound (5) was dissolved in 100 parts of a mixed solvent (45 parts of methyl ethyl ketone/45 parts of toluene). 5 parts of a poly(vinyl butyral) resin (Denka 3000-K; manufactured by Denka Company Limited) was added little by little to the solution with stirring to produce an ink.

The ink was applied to a poly(ethylene terephthalate) film (Lumirror; manufactured by Toray Industries, Inc.) 4.5 μm in thickness such that the thickness of the ink after drying was 1 μm. The ink was dried to form a thermal transfer recording sheet (1).

Exemplary Embodiments D-2 and D-3

Thermal transfer recording sheets (2) and (3) were produced in the same manner as in the production example of Exemplary Embodiment D-1 except that the compound (5) was replaced by the compound (16) or (20).

Comparative Examples D-1 and D-2

Comparative thermal transfer recording sheets (1) and (2) were produced in the same manner as in Exemplary Embodiment D-1 except that the compound (5) was replaced by the comparative compound (1) or (2).

[Evaluation of Optical Density]

The optical density (OD(Y)) of each sample was measured with the reflection densitometer SpectroLino (manufactured by Gretag Macbeth). The evaluation criteria were as follows:

A: OD(Y) of 2.0 or more (very high optical density),

B: OD(Y) of 1.5 or more and less than 2.0 (high optical density), and

C: OD(Y) of less than 1.5 (low optical density).

[Evaluation of Light Resistance]

A 20-hour exposure test of the color filters and the thermal transfer recording sheets was performed with a xenon test apparatus (Atlas Ci4000, manufactured by Suga Test Instruments Co., Ltd.) under the conditions of illuminance: 0.39

W/m² at 340 nm, temperature: 40° C., and relative humidity: 60%. The chromaticity (L*, a*, b*) of each sample based on the L*a*b* color system was measured before and after the test. The color difference ΔE was defined as described below, wherein $a^*_0$, $b^*_0$, and $L^*_0$ represent the initial chromaticity, and a*, b*, and L* represent the chromaticity after exposure.

$$\Delta E = \sqrt{(a^* - a^*_0)^2 + (b^* - b^*_0)^2 + (L^* - L^*_0)^2}$$

The evaluation criteria were as follows:

A: ΔE<2.5 (very high light resistance),
B: 2.5≤ΔE<5 (high light resistance), and
C: 5≤ΔE (low light resistance).

TABLE 3

| | Compound used | Use | OD(Y)/ rating | ΔE/ rating |
|---|---|---|---|---|
| Example C-1 | Compound (5) | Color filter (1) | 1.98/B | 2.72/B |
| Example C-2 | Compound (9) | Color filter (2) | 2.01/A | 1.88/A |
| Example C-3 | Compound (14) | Color filter (3) | 1.93/B | 1.98/A |
| Comparative example C-1 | Comparative compound (1) | Comparative color filter (1) | 1.31/C | 1.03/A |
| Comparative example C-2 | Comparative compound (2) | Comparative color filter (2) | 2.37/A | 10.51/C |
| Example D-1 | Compound (5) | Thermal transfer recording sheet (1) | 2.25/A | 2.81/B |
| Example D-2 | Compound (16) | Thermal transfer recording sheet (2) | 2.18/A | 3.26/B |
| Example D-3 | Compound (20) | Thermal transfer recording sheet (3) | 1.88/B | 4.78/B |
| Comparative example D-1 | Comparative compound (1) | Comparative thermal transfer recording sheet (1) | 1.45/C | 0.74/A |
| Comparative example D-2 | Comparative compound (2) | Comparative thermal transfer recording sheet (2) | 2.24/A | 12.36/C |

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2016-211024 filed Oct. 27, 2016, which is hereby incorporated by reference herein in its entirety.

What is claimed is:

1. A coloring compound with a structure represented by the following formula (1):

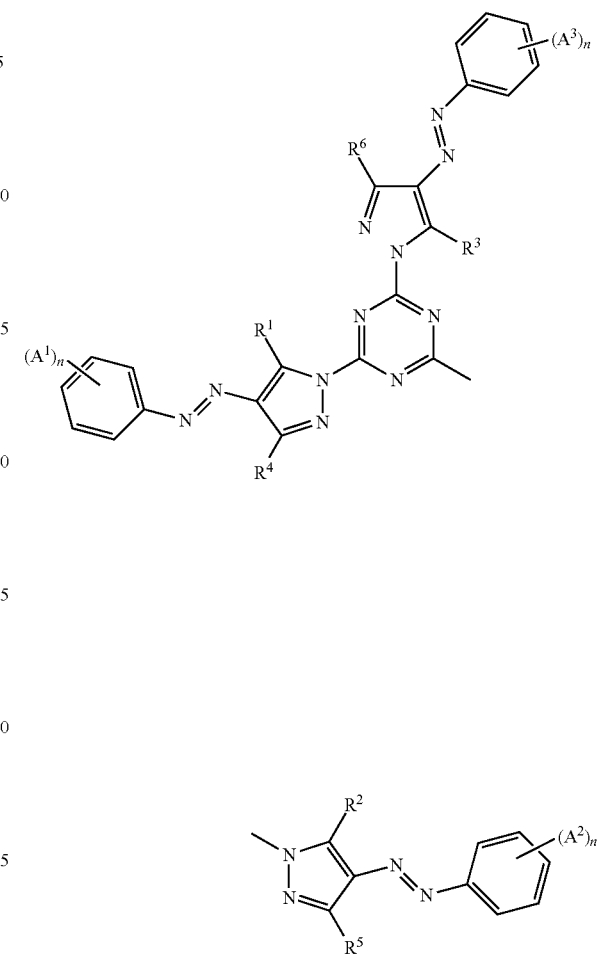

wherein $R^1$ to $R^3$ independently denote a hydrogen atom, an unsubstituted amino group, or an amino group with a substituent, $R^4$ to $R^6$ independently denote a hydrogen atom, an alkyl group, an unsubstituted aryl group, or an aryl group with a substituent, $A^1$ to $A^3$ independently denote a hydrogen atom, an alkyl group, an alkoxy group, an aryl group, a carbamoyl group, an alkoxycarbonyl group, a carboxylic acid amide group, an alkoxysulfonyl group, a sulfonic acid amide group, a trifluoromethyl group, a cyano group, a hydroxy group, a nitro group, an amino group, or a halogen atom, and the aryl group, the carboxylic acid amide group, the sulfonic acid amide group, and the amino group in $A^1$ to $A^3$ optionally have a substituent, and n denotes an integer in the range of 1 to 5.

2. The coloring compound according to claim 1, wherein $A^1$ to $A^3$ in the formula (1) independently denote an alkoxycarbonyl group, an unsubstituted carboxylic acid amide group, a carboxylic acid amide group with a substituent, an alkoxysulfonyl group, an unsubstituted sulfonic acid amide group, or a sulfonic acid amide group with a substituent.

3. A yellow toner containing a coloring compound with a structure represented by the following formula (1):

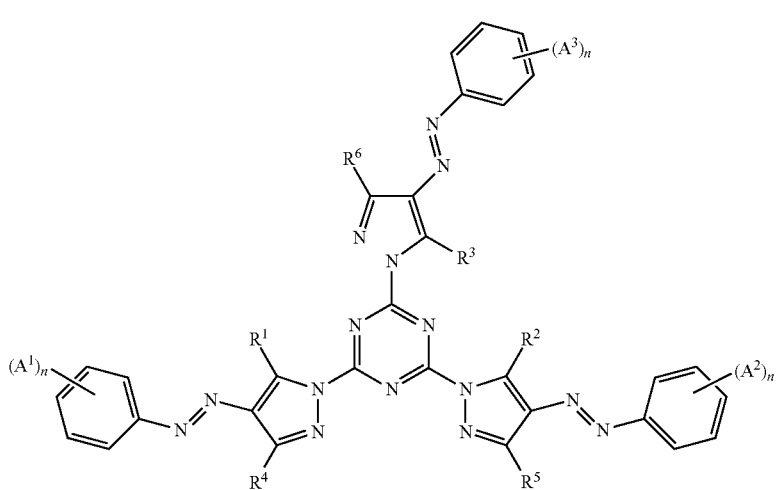

wherein $R^1$ to $R^3$ independently denote a hydrogen atom, an unsubstituted amino group, or an amino group with a substituent, $R^4$ to $R^6$ independently denote a hydrogen atom, an alkyl group, an unsubstituted aryl group, or an aryl group with a substituent, $A^1$ to $A^3$ independently denote a hydrogen atom, an alkyl group, an alkoxy group, an aryl group, a carbamoyl group, an alkoxycarbonyl group, a carboxylic acid amide group, an alkoxysulfonyl group, a sulfonic acid amide group, a trifluoromethyl group, a cyano group, a hydroxy group, a nitro group, an amino group, or a halogen atom, and the aryl group, the carboxylic acid amide group, the sulfonic acid amide group, and the amino group in $A^1$ to $A^3$ optionally have a substituent, and n denotes an integer in the range of 1 to 5.

4. An ink containing a coloring compound with a structure represented by the following formula (1):

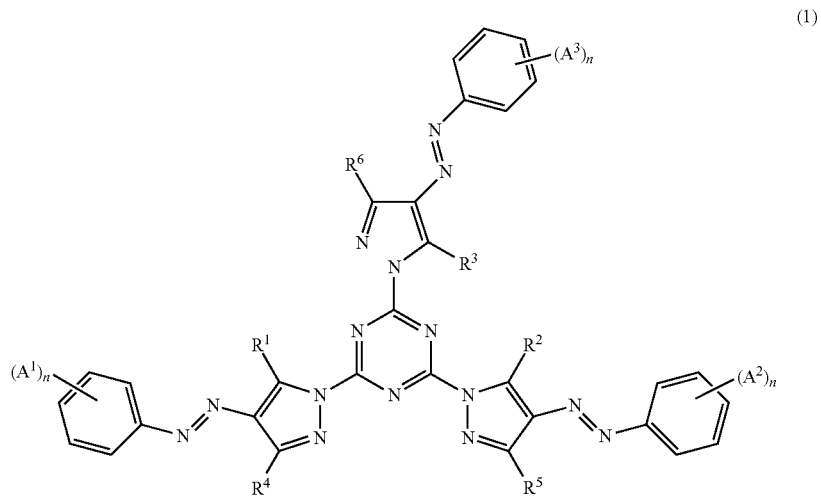

wherein $R^1$ to $R^3$ independently denote a hydrogen atom, an unsubstituted amino group, or an amino group with a substituent, $R^4$ to $R^6$ independently denote a hydrogen atom, an alkyl group, an unsubstituted aryl group, or an aryl group with a substituent, $A^1$ to $A^3$ independently denote a hydrogen atom, an alkyl group, an alkoxy group, an aryl group, a carbamoyl group, an alkoxycarbonyl group, a carboxylic acid amide group, an alkoxysulfonyl group, a sulfonic acid amide group, a trifluoromethyl group, a cyano group, a hydroxy group, a nitro group, an amino group, or a halogen atom, and the aryl group, the carboxylic acid amide group, the sulfonic acid amide group, and the amino group in $A^1$ to $A^3$ optionally have a substituent, and n denotes an integer in the range of 1 to 5.

5. A thermal transfer recording sheet comprising:

a substrate; and a coloring material layer containing a coloring compound with a structure represented by the following formula (1) on the substrate,

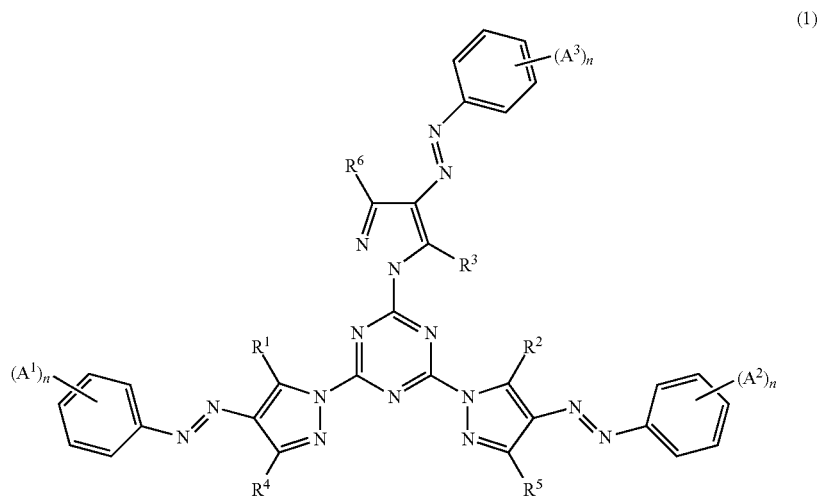

(1)

wherein $R^1$ to $R^3$ independently denote a hydrogen atom, an unsubstituted amino group, or an amino group with a substituent, $R^4$ to $R^6$ independently denote a hydrogen atom, an alkyl group, an unsubstituted aryl group, or an aryl group with a substituent, $A^1$ to $A^3$ independently denote a hydrogen atom, an alkyl group, an alkoxy group, an aryl group, a carbamoyl group, an alkoxycarbonyl group, a carboxylic acid amide group, an alkoxysulfonyl group, a sulfonic acid amide group, a trifluoromethyl group, a cyano group, a hydroxy group, a nitro group, an amino group, or a halogen atom, and the aryl group, the carboxylic acid amide group, the sulfonic acid amide group, and the amino group in $A^1$ to $A^3$ optionally have a substituent, and n denotes an integer in the range of 1 to 5.

6. A color filter resist composition containing a coloring compound with a structure represented by the following formula (1),

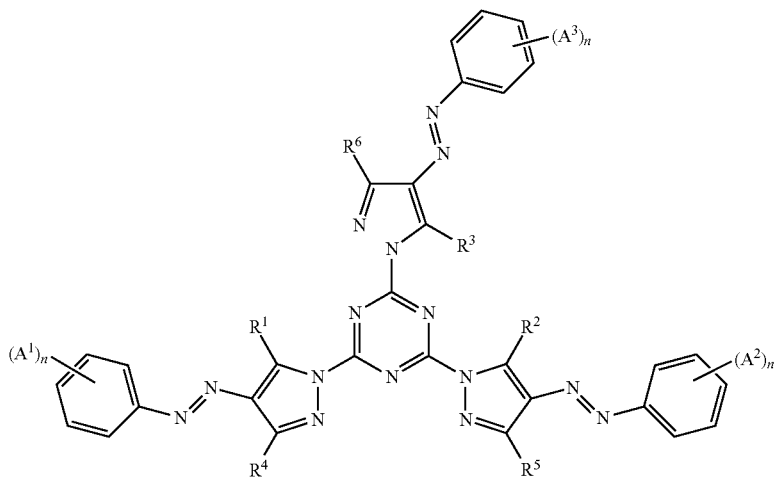

(1)

wherein $R^1$ to $R^3$ independently denote a hydrogen atom, an unsubstituted amino group, or an amino group with a substituent, $R^4$ to $R^6$ independently denote a hydrogen atom, an alkyl group, an unsubstituted aryl group, or an aryl group with a substituent, $A^1$ to $A^3$ independently denote a hydrogen atom, an alkyl group, an alkoxy group, an aryl group, a carbamoyl group, an alkoxycarbonyl group, a carboxylic acid amide group, an alkoxysulfonyl group, a sulfonic acid amide group, a trifluoromethyl group, a cyano group, a hydroxy group, a nitro group, an amino group, or a halogen atom, and the aryl group, the carboxylic acid amide group, the sulfonic acid amide group, and the amino group in $A^1$ to $A^3$ optionally have a substituent, and n denotes an integer in the range of 1 to 5.

\* \* \* \* \*